(12) United States Patent
Kawae et al.

(10) Patent No.: US 8,095,104 B2
(45) Date of Patent: Jan. 10, 2012

(54) SEMICONDUCTOR DEVICE AND ELECTRONIC DEVICE HAVING THE SAME

(75) Inventors: Daisuke Kawae, Isehara (JP); Masami Endo, Atsugi (JP); Yoshiyuki Kurokawa, Sagamihara (JP); Takayuki Ikeda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 706 days.

(21) Appl. No.: 11/812,761

(22) Filed: Jun. 21, 2007

(65) Prior Publication Data

US 2008/0014893 A1 Jan. 17, 2008

(30) Foreign Application Priority Data

Jun. 30, 2006 (JP) .................. 2006-181885

(51) Int. Cl.
*H04B 1/28* (2006.01)
(52) U.S. Cl. ............ 455/333; 455/76; 331/57; 331/186
(58) Field of Classification Search .............. 455/76, 455/333; 331/57, 185, 186; 327/291, 143; 365/201, 222
See application file for complete search history.

(56) References Cited

U.S. PATENT DOCUMENTS

| | | | |
|---|---|---|---|
| 5,133,064 A | 7/1992 | Hotta et al. | |
| 5,359,727 A | 10/1994 | Kurita et al. | |
| 5,506,982 A | 4/1996 | Hotta et al. | |
| 5,568,103 A * | 10/1996 | Nakashima et al. | 331/185 |
| 5,568,512 A | 10/1996 | Rotzoll | |
| 5,956,378 A | 9/1999 | Soda | |
| 5,994,933 A | 11/1999 | Yamanaka et al. | |
| 6,054,885 A * | 4/2000 | Ooishi et al. | 327/291 |
| 6,130,602 A | 10/2000 | O'Toole et al. | |
| 6,223,990 B1 | 5/2001 | Kamei | |
| 6,342,818 B1 | 1/2002 | Segawa et al. | |
| 6,639,509 B1 | 10/2003 | Martinez | |

(Continued)

FOREIGN PATENT DOCUMENTS

CN 1192816 9/1998
(Continued)

OTHER PUBLICATIONS

Chinese Office Action (Application No. 200710112265.0) Dated Oct. 29, 2010.

*Primary Examiner* — Junpeng Chen
(74) *Attorney, Agent, or Firm* — Eric J. Robinson; Robinson Intellectual Property Law Office, P.C.

(57) ABSTRACT

A semiconductor device includes an antenna circuit for receiving a wireless signal, a power supply circuit generating power by the wireless signal received by the antenna circuit, and a clock generation circuit to which power is supplied. The clock generation circuit includes a ring oscillator which self-oscillates and a frequency divider which adjusts frequency of an output signal of the ring oscillator in an appropriate range. A digital circuit portion is driven by a clock having high frequency accuracy, so that a malfunction such as an incorrect operation or no response is prevented.

14 Claims, 23 Drawing Sheets

U.S. PATENT DOCUMENTS

| | | |
|---|---|---|
| 6,894,624 B2 | 5/2005 | Kim et al. |
| 6,958,659 B2 * | 10/2005 | Nakajima ........................ 331/57 |
| 2002/0021179 A1 * | 2/2002 | Ooishi et al. ..................... 331/57 |
| 2002/0145925 A1 * | 10/2002 | Sato et al. ....................... 365/201 |
| 2004/0257164 A1 * | 12/2004 | Noguchi .......................... 331/57 |
| 2005/0094421 A1 * | 5/2005 | Flore et al. ...................... 363/60 |
| 2006/0146631 A1 * | 7/2006 | Jang ............................... 365/222 |
| 2006/0267690 A1 | 11/2006 | Osada |
| 2009/0167446 A1 * | 7/2009 | Higashi ........................... 331/57 |

FOREIGN PATENT DOCUMENTS

| | | |
|---|---|---|
| EP | 498449 A2 * | 8/1992 |
| GB | 2288086 A * | 10/1995 |
| JP | 07-326964 | 12/1995 |
| JP | 10-233768 | 9/1998 |
| WO | WO-97/00493 | 1/1997 |

* cited by examiner

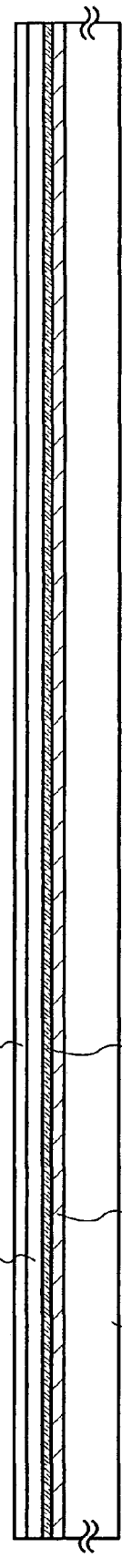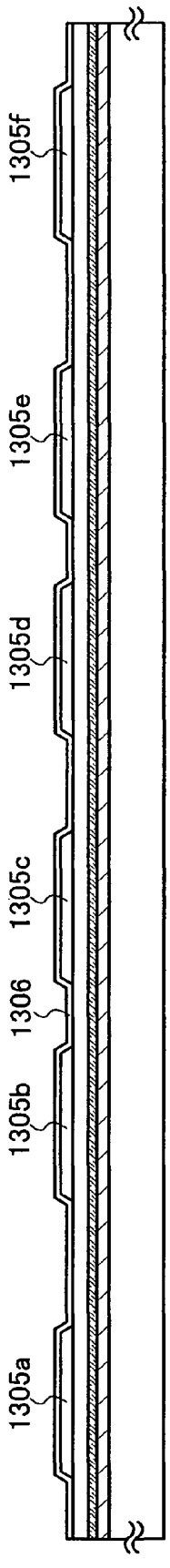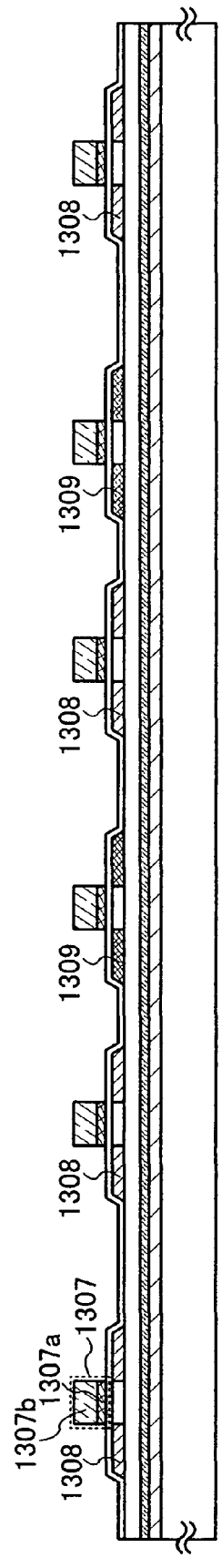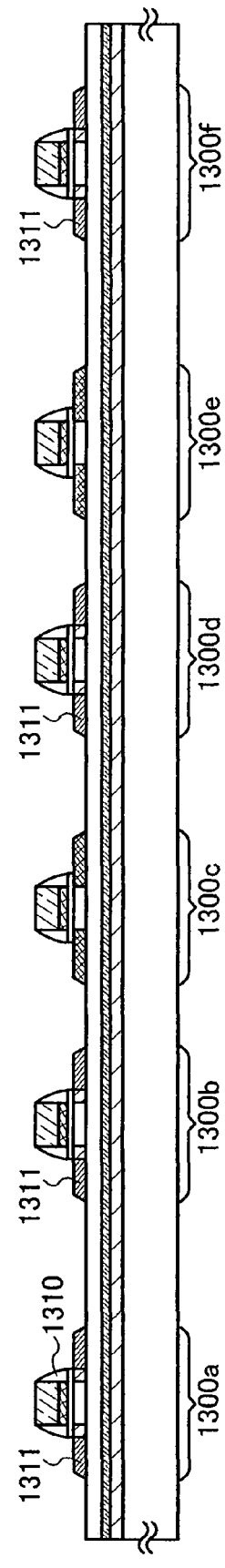

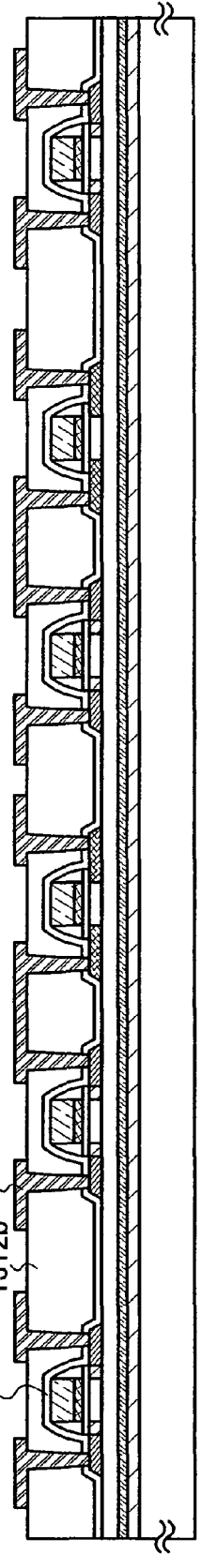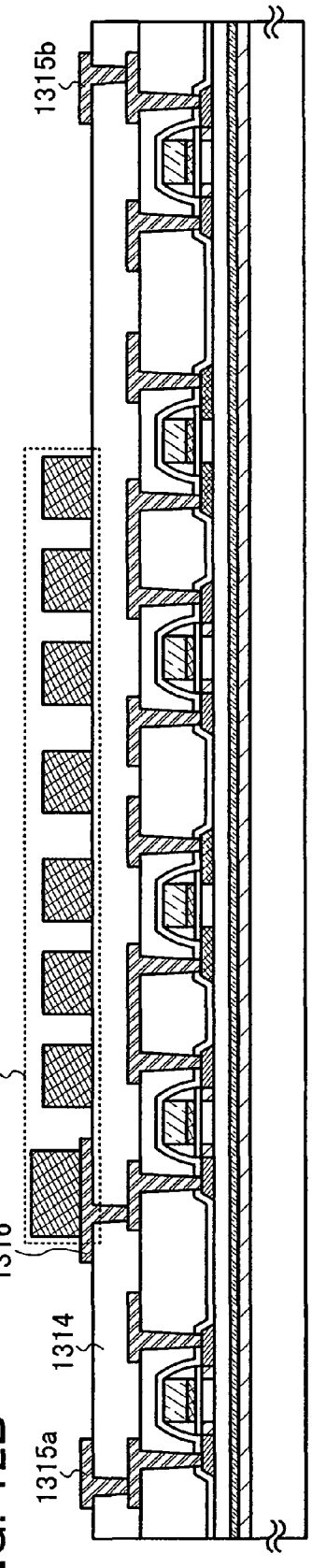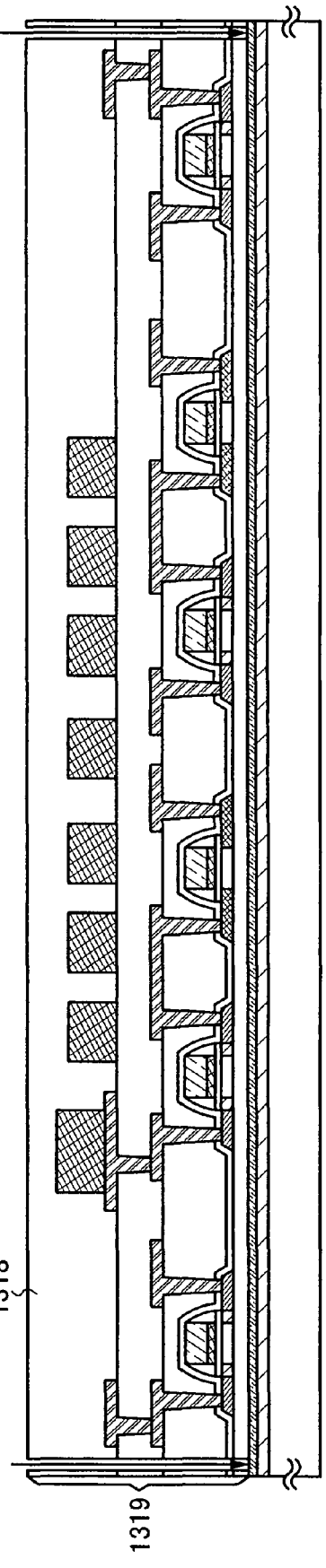

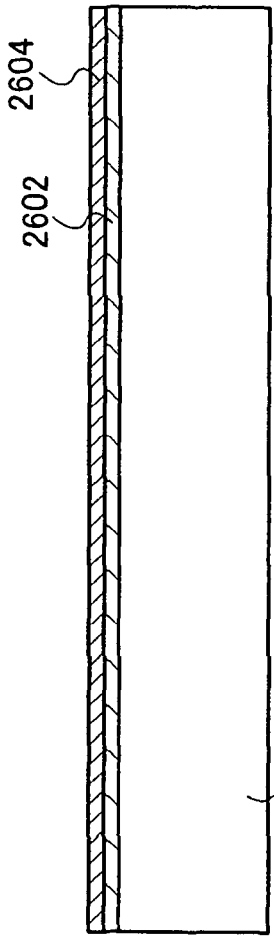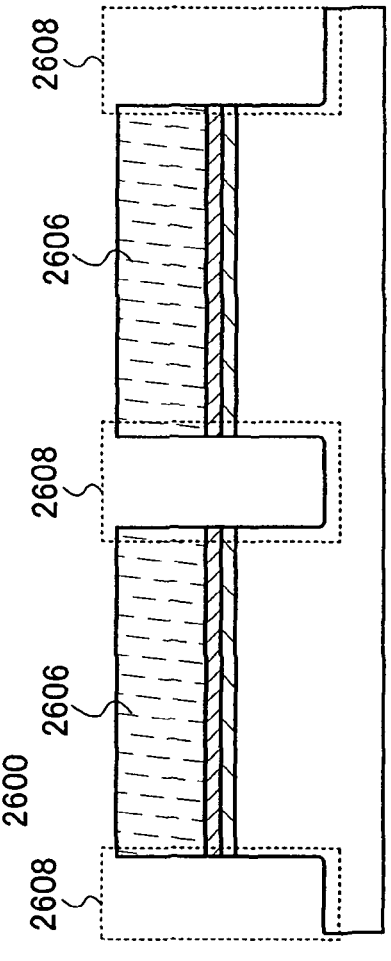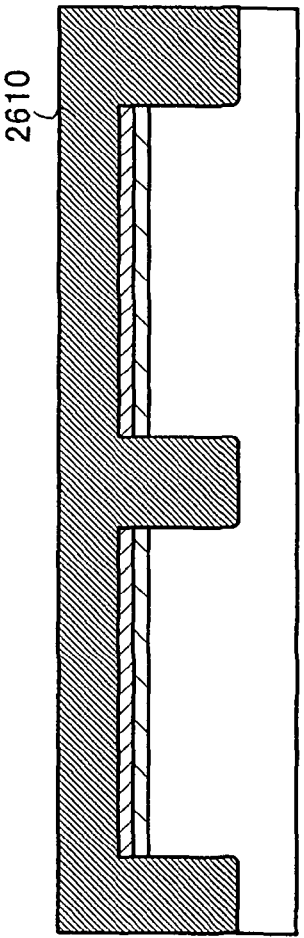

3000

3000

3000

3000

3000

3000

SEMICONDUCTOR DEVICE AND ELECTRONIC DEVICE HAVING THE SAME

BACKGROUND OF THE INVENTION

1. Field of the Invention

The present invention relates to a semiconductor device which can communicate data by wireless communication. In particular, the invention relates to a semiconductor device including a clock generation circuit inside, which generates a clock not depending on a signal of wireless communication. Further, the invention relates to an electronic device including the semiconductor device.

2. Description of the Related Art

In recent years, it is called ubiquitous information society that an environment in which it is possible to access an information network anytime and anywhere has been put into place. In such environment, an individual identification technique has attracted attention in which an ID (Individual Identification number) is given to an individual object to clarify records of the object so that it is useful for production, management, and the like. Among them, an RFID (Radio Frequency IDentification) technique using a semiconductor device which can communicate data by wireless communication such as an RFID tag (also called an IC tag, an RF tag, a wireless tag, or an electronic tag) has been used.

A common structure of a semiconductor device which can communicate data by wireless communication is described with reference to FIG. 2. A semiconductor device 201 which can communicate data by wireless communication includes an antenna 202 and a semiconductor integrated circuit 211. The semiconductor integrated circuit 211 includes circuit blocks of a high frequency circuit 203, a power supply circuit 204, a reset circuit 205, a clock generation circuit 206, a data demodulation circuit 207, a data modulation circuit 208, a control circuit 209, a memory circuit 210, and the like. A radio signal is received by the antenna 202. The radio signal is transmitted to the power supply circuit 204 through the high frequency circuit 203, and power is generated. This power is supplied to a plurality of circuits which form the semiconductor integrated circuit 211. On the other hand, a signal demodulated by the data demodulation circuit 207 through the high frequency circuit 203 and a signal which passes through the reset circuit 205 through the high frequency circuit 203 are transmitted to the control circuit 209. Then, the signals transmitted to the control circuit 209 are analyzed by the control circuit 209. Information stored in the memory circuit 210 is output in accordance with an analyzed signal. Information output from the memory circuit 210 is encoded through the control circuit 209. In addition, an encoded signal is transmitted as the wireless signal by the antenna 202 through the data modulation circuit 208.

In the circuit blocks shown in FIG. 2, a digital signal is input and output in each of the clock generation circuit 206, the control circuit 209, and the memory circuit 210. Among them, the clock generation circuit 206 is a block which generates a reference signal for exactly operating the digital circuit portion, and a function thereof is important. A PLL (Phase Locked Loop) circuit is usually used for such a clock generation circuit 206. As specific examples of a PLL circuit, circuits with various methods, for example, including circuits disclosed in Reference 1: Japanese Published Patent Application No. H7-326964 and Reference 2: Japanese Published Patent Application No. H10-233768 have been developed.

SUMMARY OF THE INVENTION

Hereinafter, FIG. 3 shows a basic structure of a conventional PLL circuit. The PLL circuit shown in FIG. 3 includes a phase comparator 301, a loop filter 302 (hereinafter also referred to as an LF), a voltage controlled oscillator 303 (hereinafter also referred to as a VCO), and a frequency divider 304. In FIG. 3, the PLL circuit changes a variable frequency signal input to the PLL circuit (corresponding to an INPUT in FIG. 3) into a feedback signal and performs phase comparison of the feedback signal to a supplied signal. Then, the PLL circuit performs adjustment by negative feedback so that phases of the supplied signal and the feedback signal become constant. In FIG. 3, the phase comparator 301 detects a phase difference between a signal Fs which is input from outside and a signal Fo/N which is input from the frequency divider 304. The loop filter 302 generates a signal Vin in which an alternating current component is eliminated from a signal supplied from the phase comparator 301. In addition, the voltage controlled oscillator 303 outputs a signal Fo in accordance with the signal Vin input from the loop filter 302. Further, the frequency divider 304 outputs the signal Fo/N in which the signal Fo input from the voltage controlled oscillator 303 is frequency-divided into 1/N.

In this case, when the PLL circuit receives the variable frequency signal Fs from outside, a stably synchronous clock is generated because the PLL circuit performs phase comparison of the signal Fs to a received signal. However, when the PLL circuit does not receive the variable frequency signal Fs from outside, the PLL circuit has to keep self-oscillation by a clock output by the PLL circuit itself.

On the other hand, a demodulation signal input to the clock generation circuit 206 in FIG. 2 is serial data in which a period of a voltage level corresponding to a logic value "high" (hereinafter also referred to as an H level) and a period of a voltage level corresponding to a logic value "low" (hereinafter also referred to as an L level) are arranged in chronological order in accordance with a wireless communication standard. Inputting such a demodulation signal to the conventional PLL circuit means that there is a period which corresponds to the case of not receiving the signal Fs in the description about FIG. 3.

FIG. 4 shows a period of adjustment by negative feedback and a period of self-oscillation when the conventional PLL circuit is used for the clock generation circuit 206 in FIG. 2. A waveform 401 shows a demodulation signal input to the PLL circuit and a waveform 402 shows a feedback signal output from a frequency divider in the PLL circuit. A period 403 shows the period of adjustment by negative feedback and a period 404 shows the period of self-oscillation.

As shown in FIG. 4, since there is a period during which negative feedback is not performed, the PLL circuit becomes unstable so that it cannot generate a constant stable clock. Therefore, frequency of the clock is fluctuated so that a communication problem is generated. Accordingly, the digital circuit portion which forms the semiconductor device shown in FIG. 2 malfunctions in some cases.

In addition to the above-described problem, when variable frequency from outside in the semiconductor device which communicates data by wireless communication is high, a reference clock with 50% duty ratio for outputting a stable clock signal in the clock generation circuit inside the semiconductor device cannot be obtained in some cases.

In view of the foregoing problems, it is an object of the invention to prevent a malfunction such as an incorrect operation or no response which is caused by utilizing a clock generated based on a demodulated signal in a semiconductor device which can communicate data by wireless communication.

In order to solve the aforementioned problems, in the invention, a semiconductor device which communicates data by wireless communication includes a ring oscillator which self-oscillates not depending on a demodulated signal and a frequency divider which adjusts frequency of an output signal of the ring oscillator in an appropriate range. Hereinafter, specific structures of the invention are described.

A semiconductor device in accordance with one aspect of the invention includes an antenna circuit for receiving a wireless signal, a power supply circuit generating power by the wireless signal received by the antenna circuit, and a clock generation circuit to which power is supplied. The clock generation circuit includes a ring oscillator for oscillating a signal of a constant period and a frequency divider for frequency-dividing a signal output from the ring oscillator.

A semiconductor device in accordance with another aspect of the invention includes an antenna circuit for receiving a wireless signal, a power supply circuit generating power by the wireless signal received by the antenna circuit, and a clock generation circuit to which power is supplied. The clock generation circuit includes a ring oscillator for oscillating a signal of a constant period and a frequency divider for frequency-dividing a signal output from the ring oscillator. A capacitor for controlling oscillation frequency of the ring oscillator is connected to each stage of the ring oscillator.

Note that in the invention, the capacitor may be an element using gate capacitance of a MOS transistor.

Note that in the invention, the capacitor may be a variable capacitor.

Note that in the invention, a transistor which forms the ring oscillator and the frequency divider may be a thin film transistor.

Note that in the invention, the transistor which forms the ring oscillator and the frequency divider may be a transistor formed on a single crystalline substrate.

Note that in the invention, description "being connected" includes the case where elements are electrically connected and the case where elements are directly connected. Accordingly, in structures disclosed in the invention, another element which enables an electrical connection (e.g., a switch, a transistor, a capacitor, an inductor, a resistor, or a diode) may be interposed between elements having a predetermined connection relation. Alternatively, the elements may be directly connected without interposing another element therebetween. In the case where elements are connected without interposing another element which enables an electrical connection therebetween and a direct connection is only included, description 'being directly connected' is employed. Note also that description "being electrically connected" includes the case where elements are electrically connected and the case where elements are directly connected.

Note that in the invention, various types of transistors can be applied to a transistor without limiting to a certain type. Accordingly, a thin film transistor (TFT) using a non-single crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be employed. Note that a non-single crystalline semiconductor film may include hydrogen or halogen. In addition, a transistor can be formed using various types of substrates. The type of a substrate is not limited to a certain type. Therefore, for example, a single crystalline substrate, an SOI substrate, a glass substrate, a quartz substrate, a plastic substrate, a paper substrate, a cellophane substrate, a stone substrate, a stainless steel substrate, a substrate including a stainless steel foil, or the like can be used as a substrate.

Further, the transistor may be formed using one substrate, and then, the transistor may be transferred to another substrate.

The structure of a transistor can be various modes without limiting to a certain structure. For example, a multi-gate structure having two or more gate electrodes may be used. By using the multi-gate structure, off-current can be reduced; the withstand voltage of the transistor can be increased to improve reliability; or a drain-source current does not fluctuate very much even if a drain-source voltage fluctuates when the transistor operates in the saturation region so that flat characteristics can be obtained. In addition, a structure where gate electrodes are formed above and below a channel may be used. By using the structure where gate electrodes are formed above and below the channel, a channel region is enlarged to increase the amount of a current flowing therethrough, or a depletion layer can be easily formed to decrease the S value. Further, a structure where a gate electrode is formed above a channel, a structure where a gate electrode is formed below a channel, a staggered structure, or an inversely staggered structure may be used; or a channel region may be divided into a plurality of regions and the divided regions may be connected in parallel or in series. A source electrode or a drain electrode may overlap with a channel (or a part of it). By using the structure where the source electrode or the drain electrode overlaps with the channel (or a part of it), the case can be prevented in which electric charges are accumulated in a part of the channel, which would result in an unstable operation. Moreover, an LDD region may be provided. By providing the LDD region, off-current can be reduced; the withstand voltage of the transistor can be increased to improve reliability; or a drain-source current does not fluctuate very much even if a drain-source voltage fluctuates when the transistor operates in the saturation region so that flat characteristics can be obtained.

Note that a transistor is an element having at least three terminals of a gate, a drain, and a source. The transistor has a channel region between a drain region and a source region. Here, since the source and the drain of the transistor may change depending on the structure, the operating condition, and the like of the transistor, it is difficult to define which is a source or a drain. Therefore, in the invention, a region functioning as a source and a drain may not be called the source or the drain. In such a case, for example, one of the source and the drain may be called a first terminal and the other thereof may be called a second terminal.

A gate means all or a part of a gate electrode and a gate wiring (also called a gate line). A gate electrode means a conductive film which overlaps with a semiconductor which forms a channel region, an LDD (Lightly Doped Drain) region, or the like with a gate insulating film interposed therebetween.

Note also that a source means all or a part of a source region, a source electrode, and a source wiring (also called a source line or a source signal line). A source region means a semiconductor region containing a large amount of p-type impurities (e.g., boron or gallium) or n-type impurities (e.g., phosphorus or arsenic). Accordingly, a region containing a small amount of p-type impurities or n-type impurities, namely, an LDD (Lightly Doped Drain) region is not included in the source region. A source electrode is a part of a conductive layer formed of a material different from that of a source region, and electrically connected to the source region. However, there is the case where a source electrode and a source region are collectively called a source electrode. A source wiring is a wiring for connecting source electrodes of pixels to each other, or a wiring for connecting a source electrode to another wiring.

However, there is a portion functioning as both a source electrode and a source wiring. Such a region may be called either a source electrode or a source wiring. That is, there is a region where a source electrode and a source wiring cannot be clearly distinguished from each other. For example, in the case where a source region overlaps with an extended source wiring, the overlapped region functions as both a source wiring and a source electrode. Accordingly, such a region may be called either a source electrode or a source wiring.

In addition, a region formed of the same material as a source electrode and connected to the source electrode, or a portion for connecting a source electrode to another source electrode may also be called a source electrode. A portion which overlaps with a source region may also be called a source electrode. Similarly, a region formed of the same material as a source wiring and connected to the source wiring may be called a source wiring. In a strict sense, such a region may not have a function of connecting the source electrode to another source electrode. However, there is a region formed of the same material as the source electrode or the source wiring, and connected to the source electrode or the source wiring. Accordingly, such a region may also be called either a source electrode or a source wiring.

In addition, for example, a part of a conductive film which connects a source electrode and a source wiring may be called either a source electrode or a source wiring.

Note that a source terminal means a part of a source region, a part of a source electrode, or a part of a region electrically connected to the source electrode.

Note also that the same can be said for a drain.

In the invention, a semiconductor device means a device having a circuit including a semiconductor element (e.g., a transistor or a diode). The semiconductor device may also include all devices that can function by utilizing semiconductor characteristics.

In the invention, description that an object is "formed on" or "formed over" another object does not necessarily mean that the object is formed in direct contact with another object. The description includes the case where two objects are not in direct contact with each other, that is, the case where another object is interposed therebetween. Accordingly, for example, when it is described that a layer B is formed on (or over) a layer A, it includes both of the case where the layer B is formed in direct contact with the layer A, and the case where another layer (e.g., a layer C or a layer D) is formed in direct contact with the layer A and the layer B is formed in direct contact with the layer C or D. Similarly, when it is described that an object is formed above another object, it does not necessarily mean that the object is in direct contact with another object, and another object may be interposed therebetween. Accordingly, for example, when it is described that a layer B is formed above a layer A, it includes both of the case where the layer B is formed in direct contact with the layer A, and the case where another layer (e.g., a layer C or a layer D) is formed in direct contact with the layer A and the layer B is formed in direct contact with the layer C or D. Similarly, when it is described that an object is formed below or under another object, it includes both of the case where the objects are in direct contact with each other, and the case where the objects are not in contact with each other.

By using the invention, a digital circuit portion can be driven by a clock signal having high frequency accuracy in a semiconductor device which communicates data by wireless communication. Therefore, a malfunction such as an incorrect operation or no response can be prevented in the semiconductor device which can communicate data by wireless communication, and a semiconductor device which can exactly transmit information stored in a memory circuit in the semiconductor device can be obtained.

BRIEF DESCRIPTION OF THE DRAWINGS

In the accompanying drawings:

FIGS. 11A to 11D each illustrate a structure of Embodiment 2 using the invention;

FIGS. 12A to 12C each illustrate a structure of Embodiment 2 using the invention;

FIGS. 17A to 17C each illustrate a structure of Embodiment 4 using the invention;

DETAILED DESCRIPTION OF THE INVENTION

Hereinafter, the invention will be described in detail by way of embodiment modes and embodiments with reference to the drawings. However, the invention is not limited to description to be given below and it will be easily understood by those skilled in the art that various changes and modifications are possible, without departing from the spirit and the scope of the invention. Therefore, the invention should not be construed as being limited to the description of the embodiment modes and the embodiments.

Embodiment Mode 1

A configurational example of a semiconductor device of the invention is described with reference to a block diagram shown in FIG. 1. Note that in this embodiment mode, the case is described in which a semiconductor device is utilized as an RFID chip (hereinafter simply referred to as an "RFID") which can communicate data by wireless communication.

Figure 1:
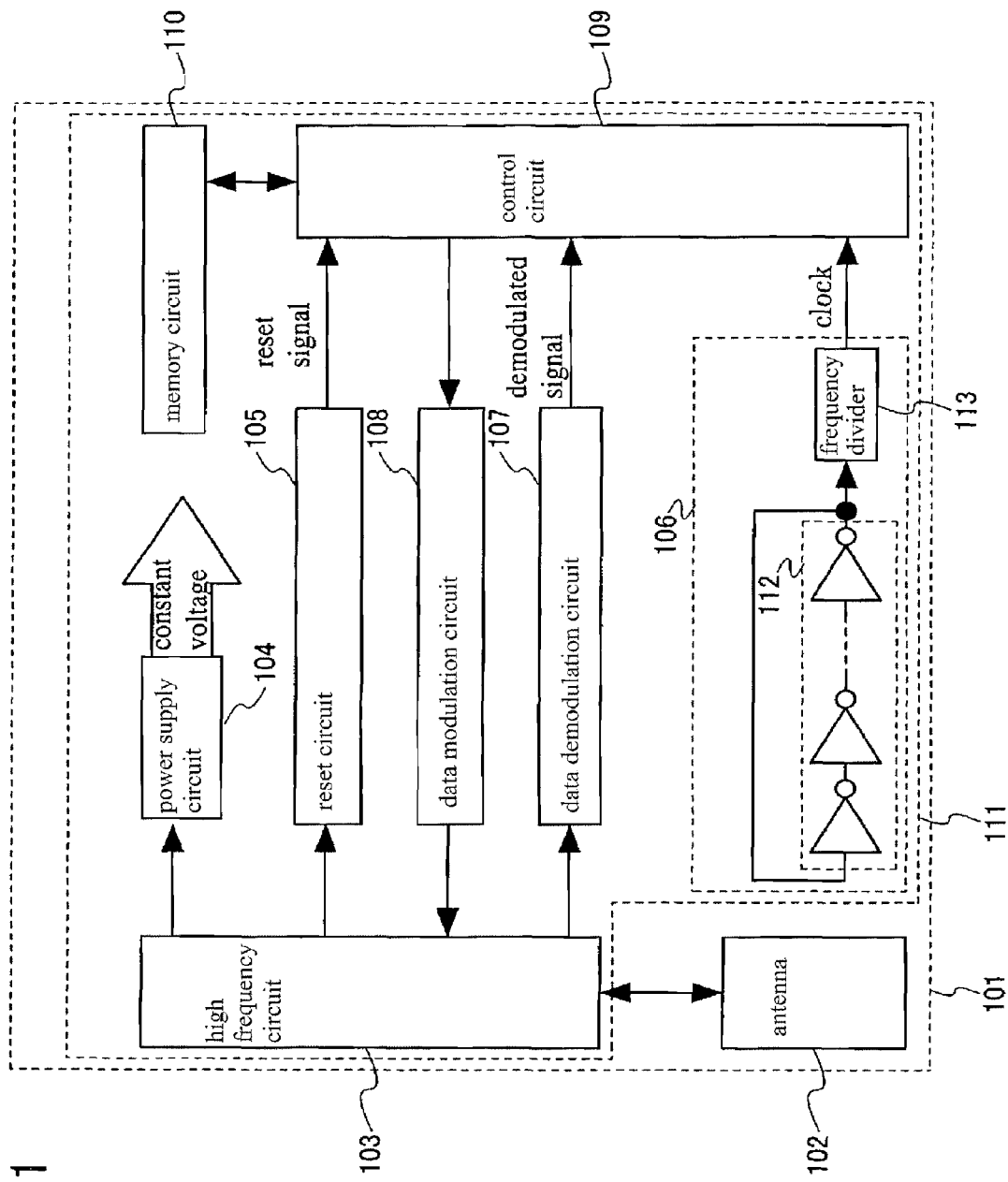
FIG. 1 illustrates a configuration of Embodiment Mode 1 of the invention.
Figure 2:
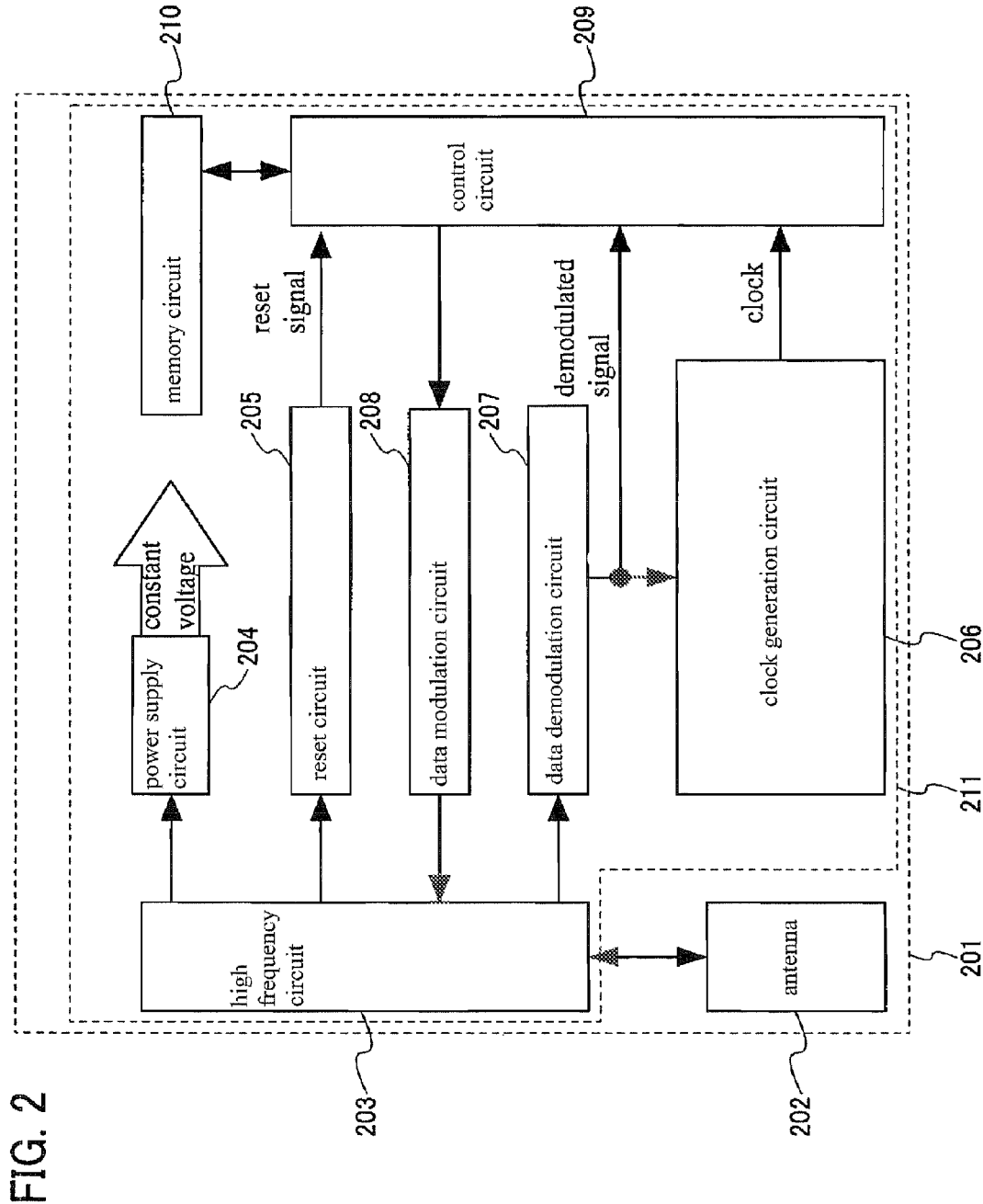
FIG. 2 illustrates a conventional configuration.
Figure 3:
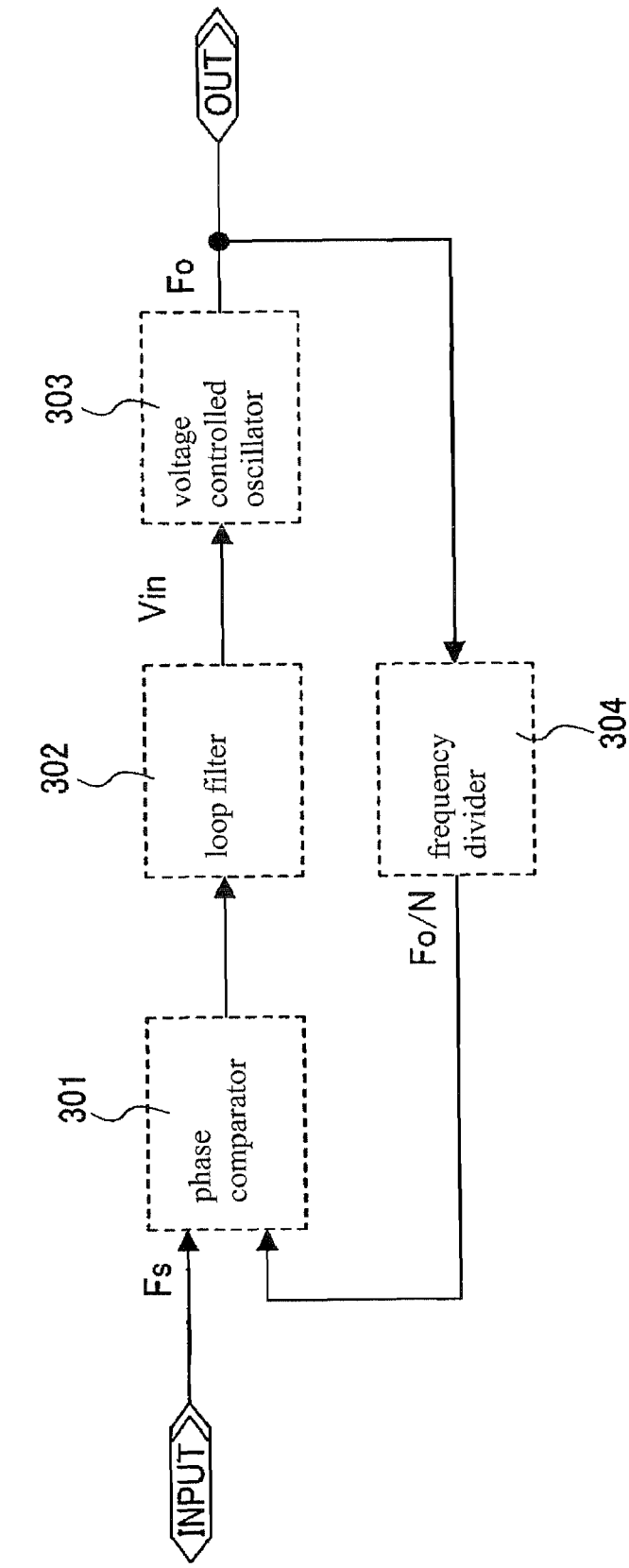
FIG. 3 illustrates a configuration of a conventional PLL.

A semiconductor device 101 in FIG. 1 includes an antenna 102 and a semiconductor integrated circuit 111. In addition, the semiconductor integrated circuit 111 includes circuit blocks of a high frequency circuit 103, a power supply circuit 104, a reset circuit 105, a clock generation circuit 106, a data demodulation circuit 107, a data modulation circuit 108, a control circuit 109, a memory circuit 110, and the like. The clock generation circuit 106 includes a ring oscillator 112 and a frequency divider 113.

Note that the semiconductor integrated circuit 111 may be an active-type RFID or a passive-type RFID. Although the semiconductor integrated circuit 111 is described as a passive-type RFID in this embodiment mode, the invention is not limited to this. In the case of an active-type RFID, it is only necessary that a battery for supplying power to the power supply circuit be provided.

Note that it is preferable to use a battery formed to be a sheet shape having a thickness of 1 μm to several μm as the battery. For example, by using a lithium battery, preferably, a lithium polymer battery using gelled electrolyte, a lithium ion battery, or the like, miniaturization can be performed.

Although not shown, the antenna 102 transmits and receives a signal to/from a reader/writer. Therefore, in a wireless communication system using the semiconductor device of the invention, the semiconductor device 101, a reader/writer with a known structure, an antenna connected to the reader/writer, and a control terminal for controlling the reader/writer can be used.

Note that in FIG. 1, any of a dipole antenna, a patch antenna, a loop antenna, and a Yagi antenna can be used for the antenna 102. Any of an electromagnetic coupling method, an electromagnetic induction method, and an electromagnetic wave method may be used for a method for transmitting and receiving a wireless signal in the antenna 102.

Note that a communication method between the semiconductor device 101 and the antenna connected to the reader/writer is one-way communication or two-way communication, and any of a space division multiplex access method (SDMA), a polarization division multiplex access method (PDMA), a frequency-division multiplex access method (FDMA), a time-division multiplex access method (TDMA), a code division multiplex access method (CDMA), and an orthogonal frequency division multiplexing method (OFDM) can be used.

A wireless signal is a signal in which a carrier wave is modulated. Modulation of a carrier wave is analog modulation or digital modulation, which may be any of amplitude modulation, phase modulation, frequency modulation, and spectrum diffusion.

Note that as frequency of a carrier wave, any of the following frequency can be used: a sub millimeter wave of 300 GHz to 3 THz; a millimeter wave of 30 GHz to 300 GHz; a microwave of 3 GHz to 30 GHz; an ultra short wave of 300 MHz to 3 GHz; a very short wave of 30 MHz to 300 MHz; a short wave of 3 MHz to 30 MHz; a medium wave of 300 KHz to 3 MHz; a long wave of 30 KHz to 300 KHz; and a very long wave of 3 KHz to 30 KHz.

Next, an operation of the semiconductor device 101 shown in FIG. 1 is described. A wireless signal received by the antenna 102 is transmitted to each circuit block through the high frequency circuit 103. Power is generated from a signal transmitted to the power supply circuit 104 through the high frequency circuit 103. This power is supplied to a plurality of circuits which form the semiconductor integrated circuit 111 including the clock generation circuit 106.

Note that various types of transistors can be employed as a transistor provided in the semiconductor integrated circuit 111 without limiting to a certain type. Accordingly, a thin film transistor (TFT) using a non-single crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be employed. Note that a non-single crystalline semiconductor film may include hydrogen or halogen. In addition, the semiconductor integrated circuit 111 can be formed using various types of substrates. The type of a substrate is not limited to a certain type. Therefore, for example, a single crystalline substrate, an SOI substrate, a glass substrate, a quartz substrate, a plastic substrate, a paper substrate, a cellophane substrate, or the like can be used as a substrate. Further, the semiconductor integrated circuit 111 may be formed using one substrate, and then, the semiconductor integrated circuit 111 may be transferred to another substrate.

Next, a configuration of the ring oscillator 112 in FIG. 1 in the invention is described. The ring oscillator 112 self-oscillates by supply of power and outputs a square wave of constant frequency. The frequency divider 113 receives an output signal of the ring oscillator 112 and divides the output signal, so that a clock signal of appropriate frequency is generated.

Figure 5:
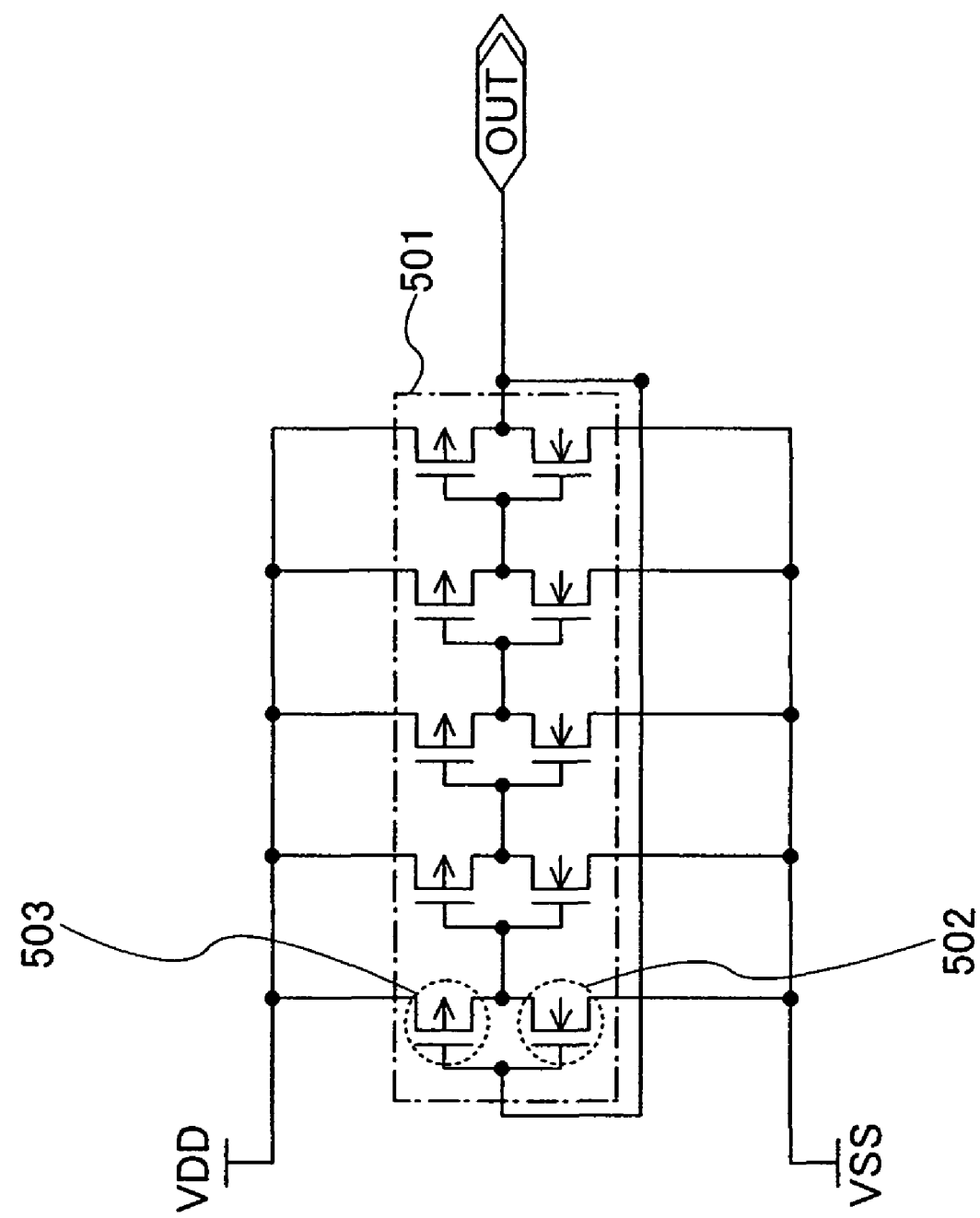
FIG. 5 illustrates a specific configuration of a ring oscillator.

FIG. 5 shows a specific configuration of a ring oscillator. In a ring oscillator 501, an N-channel transistor 502 and a P-channel transistor 503 are connected in series; an inverter structure in which gates of the two transistors are connected is included; and a plurality of inverters are included when this inverter is considered as one unit. The plurality of inverters has a loop structure in which an input terminal of a later stage and an output terminal of a previous stage are connected and an output terminal of the last stage is connected to an input terminal of a first stage. Note that in order to oscillate a signal from an oscillation circuit, it is necessary that the number of the inverters in the loop of the ring oscillator be an odd number. Note also that although the ring oscillator 501 in FIG. 5 has a five-stage structure (five units), needless to say, the invention is not limited to this. Frequency of an oscillation signal obtained by the ring oscillator is determined by characteristics of each inverter, a value of power supply voltage, and the number of stages. Accordingly, the number of stages of the inverters included in the ring oscillator is determined by comprehensively considering these factors.

Figure 6:
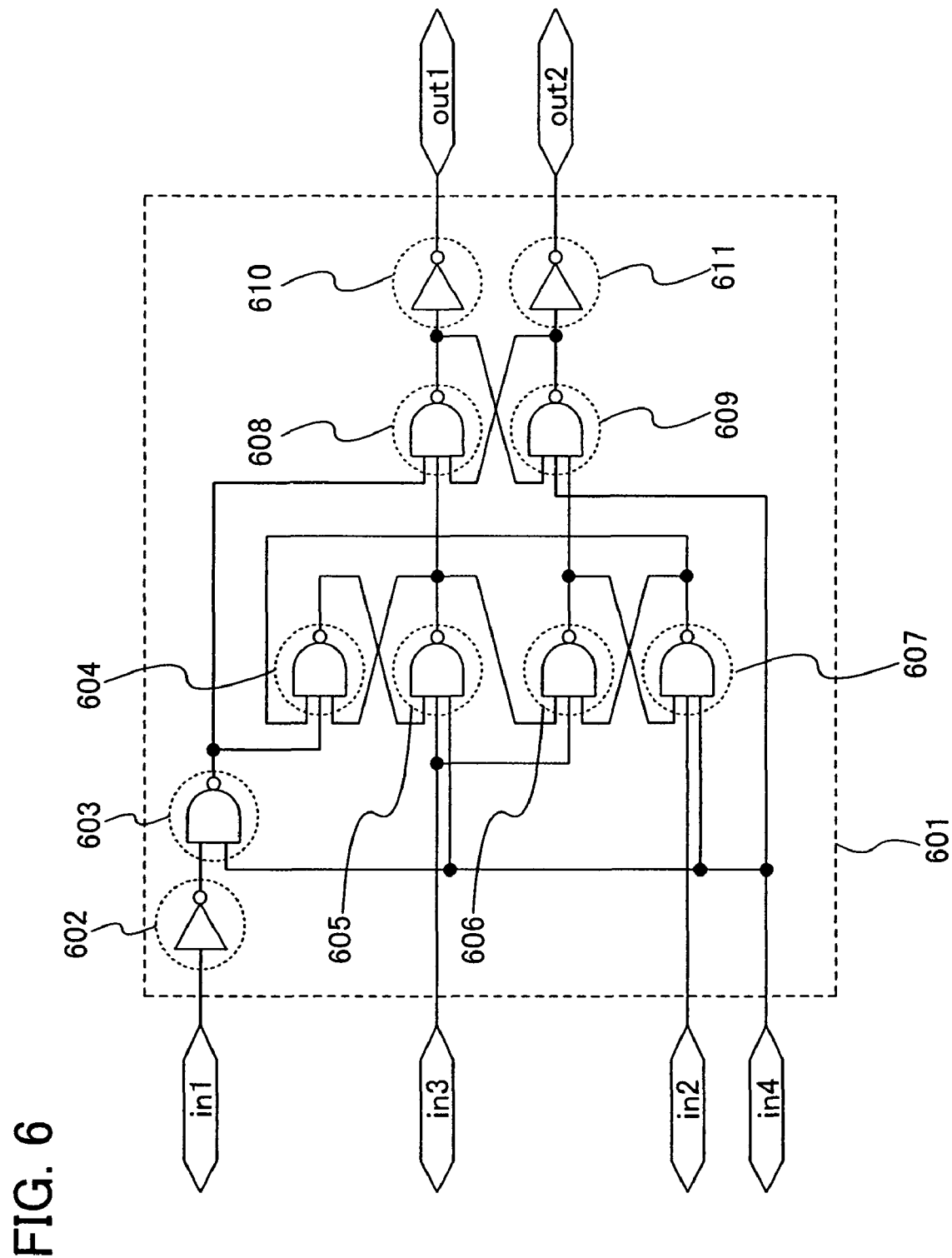
FIG. 6 illustrates a flip-flop which forms a frequency divider.

FIG. 6 shows a specific configuration of a frequency divider. The frequency divider mainly includes a plurality of flip-flops 601. The flip-flop 601 includes an inverter circuit 602, NAND circuits 603 to 609, and inverter circuits 610 and 611. In addition, the flip-flop 601 includes four input terminals (described as in1, in2, in3, and in4 in the drawing) and two output terminals (described as out1 and out2 in the drawing). The flip-flop 601 includes three latches in total. The NAND circuits 604 and 605; the NAND circuits 606 and 607; and the NAND circuits 608 and 609 each form a latch of the three. Then, when a set signal, a data signal, a clock signal, and a reset signal are input from the input terminal in1, the input terminal in2, the input terminal in3, and the input terminal in4, respectively, data signals are output from the output terminal out1 and the output terminal out2. Note that although a static flip-flop circuit is used in the aforementioned configuration, the invention is not limited to this configuration. For example, a quasi-static flip-flop circuit using an analog switch or the like may be used.

Note that the frequency divider may be a non-synchronous simple ripple counter or a synchronous counter. The frequency divider may be provided with reset mechanism and a division ratio can be programmable. A stable clock is generated in this manner and supplied to a digital circuit portion such as the control circuit 109 in FIG. 1, so that analysis, encoding, and the like of a demodulation signal can be exactly performed.

Figure 7:
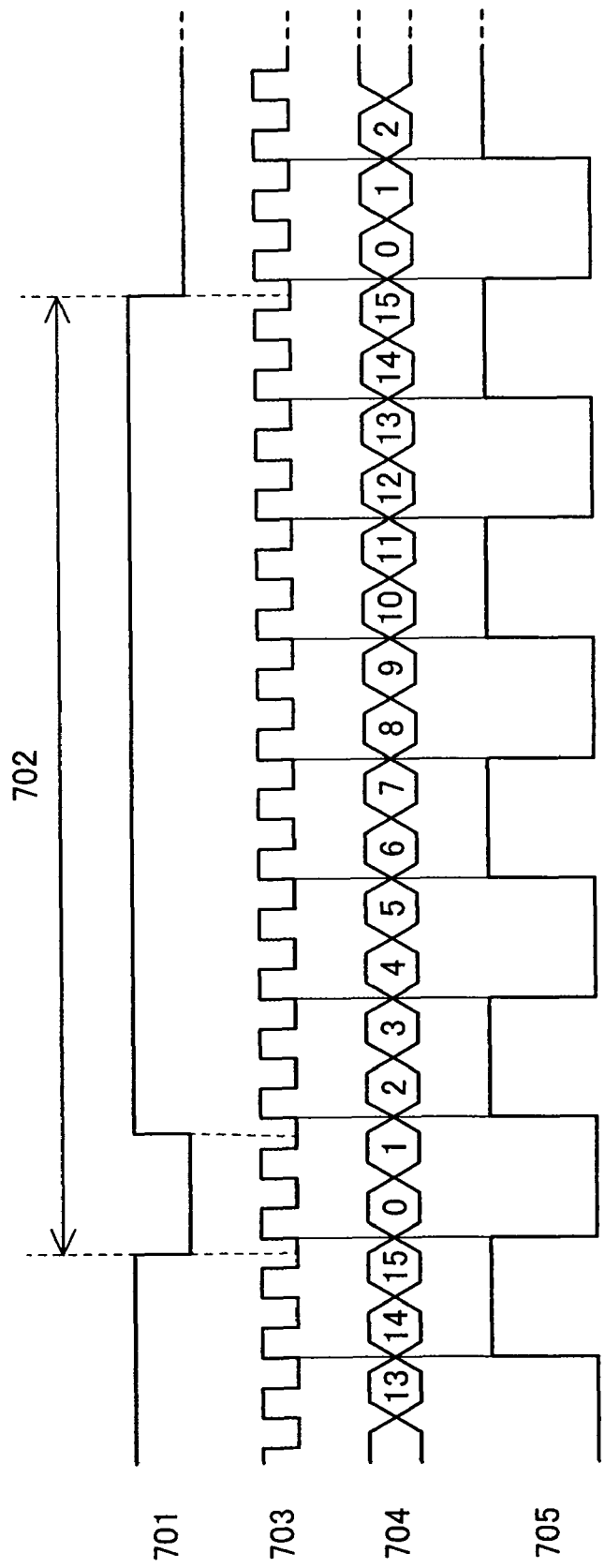
FIG. 7 illustrates an operation of a ring oscillator and a frequency divider.

Next, a timing chart of a signal input and output to/from the ring oscillator shown in FIG. 5 and the frequency divider shown in FIG. 6 is described with reference to FIG. 7.

A waveform 701 is a demodulation signal, which shows that logic 0 and logic 1 are arranged in chronological order in accordance with a wireless communication standard. A period 702 is assigned length for showing data for one bit in the demodulation signal, which is constant. A waveform 703 is a square-wave signal output from the ring oscillator, which shows that the ring oscillator oscillates with constant frequency regardless of the demodulation signal. A waveform 704 digitally shows values of a counter which forms the frequency divider. The counter counts up values in synchronization with the waveform 703 until the values are reset by fall of the waveform 701 of the demodulation signal and next fall is detected. A waveform 705 is a clock signal to be output and performs a toggle operation in accordance with the values of the waveform 704. Note that although the output signal of the ring oscillator which is four-frequency divided in this example is used as the clock signal, a division ratio is determined in accordance with requirement specification so that the invention is not limited to this.

As described above, a stable clock signal can be obtained not based on a demodulation signal from a reader/writer in the clock generation circuit in the invention. Needless to say, oscillation frequency to be obtained can be changed by setting of a division ratio.

Figure 8:
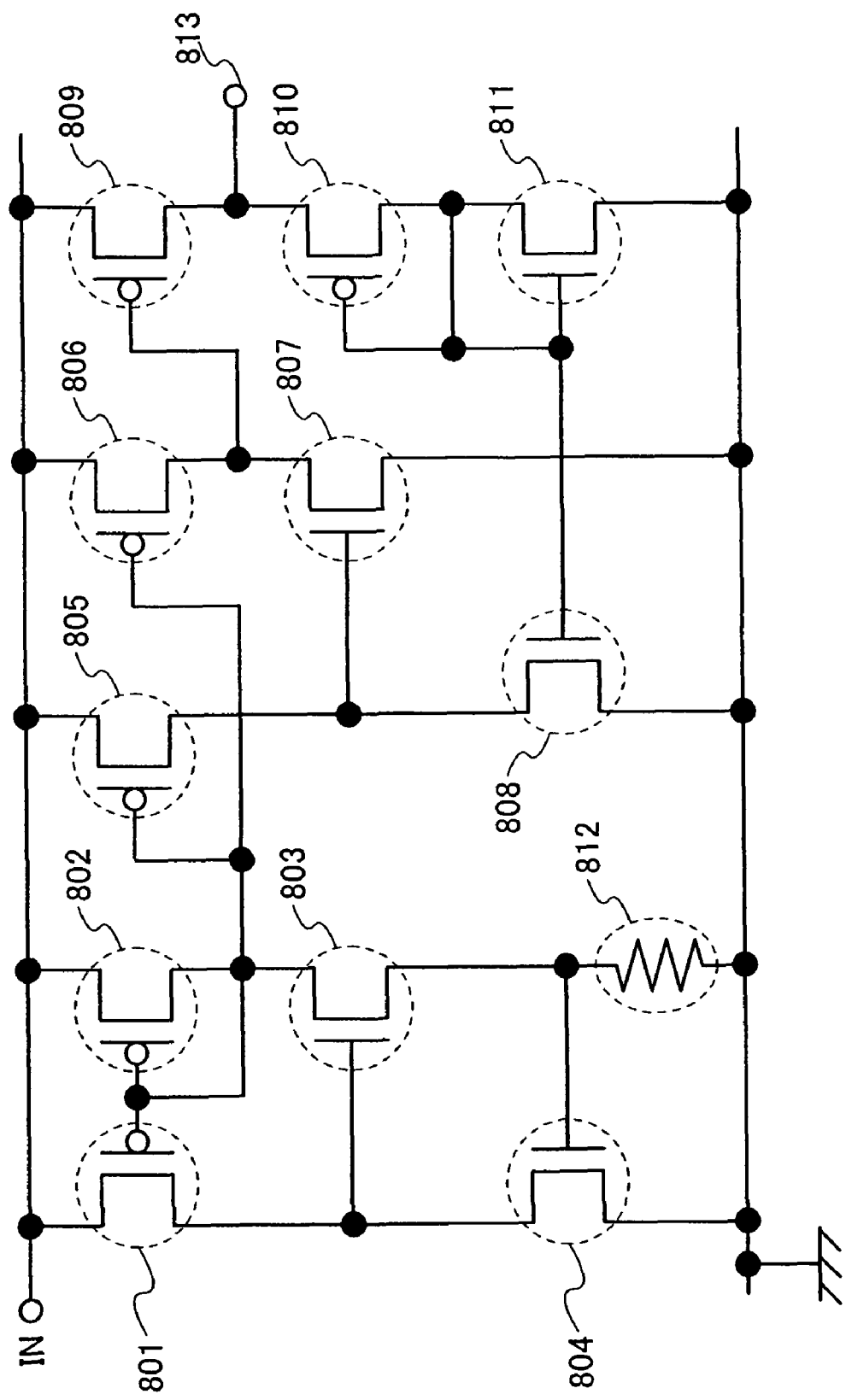
FIG. 8 illustrates a specific configurational example of a power supply circuit.

FIG. 8 shows a circuit diagram as an example of the power supply circuit in FIG. 1. A power supply circuit includes a current mirror circuit, a common source amplifier circuit, a diode-connected transistor, and the like, and transistors 801 to 811 and a resistor 812 are included therein.

A feedback loop is formed by an analog circuit included in the power supply circuit, and an output voltage is held to be constant even when a current supplied from an output terminal 813 is changed by fluctuation of a load. Note that although a typical power supply circuit is shown here, the power supply circuit which is used in the invention is not limited to that shown in FIG. 8. A circuit with another method may be used.

In addition, as the memory circuit 110 in FIG. 1, a dynamic-type memory (DRAM), a static-type memory (SRAM), a ferroelectric memory (FeRAM), a mask ROM, a volatile memory (EPROM), or a nonvolatile memory (EEPROM) can be used. Note that in the case of using a dynamic-type memory, it is necessary to add a periodic refresh function.

By the above-described configuration, in the semiconductor device of the invention which can communicate data by wireless communication, a malfunction such as an incorrect operation or no response is prevented compared with a conventional semiconductor device and information stored in the memory circuit can be exactly transmitted.

Note that this embodiment mode can be freely combined with any description in another embodiment mode and other embodiments in this specification.

Embodiment Mode 2

In Embodiment Mode 2, a configuration of the ring oscillator, which is different from that of the aforementioned embodiment mode, is described.

Figure 9:
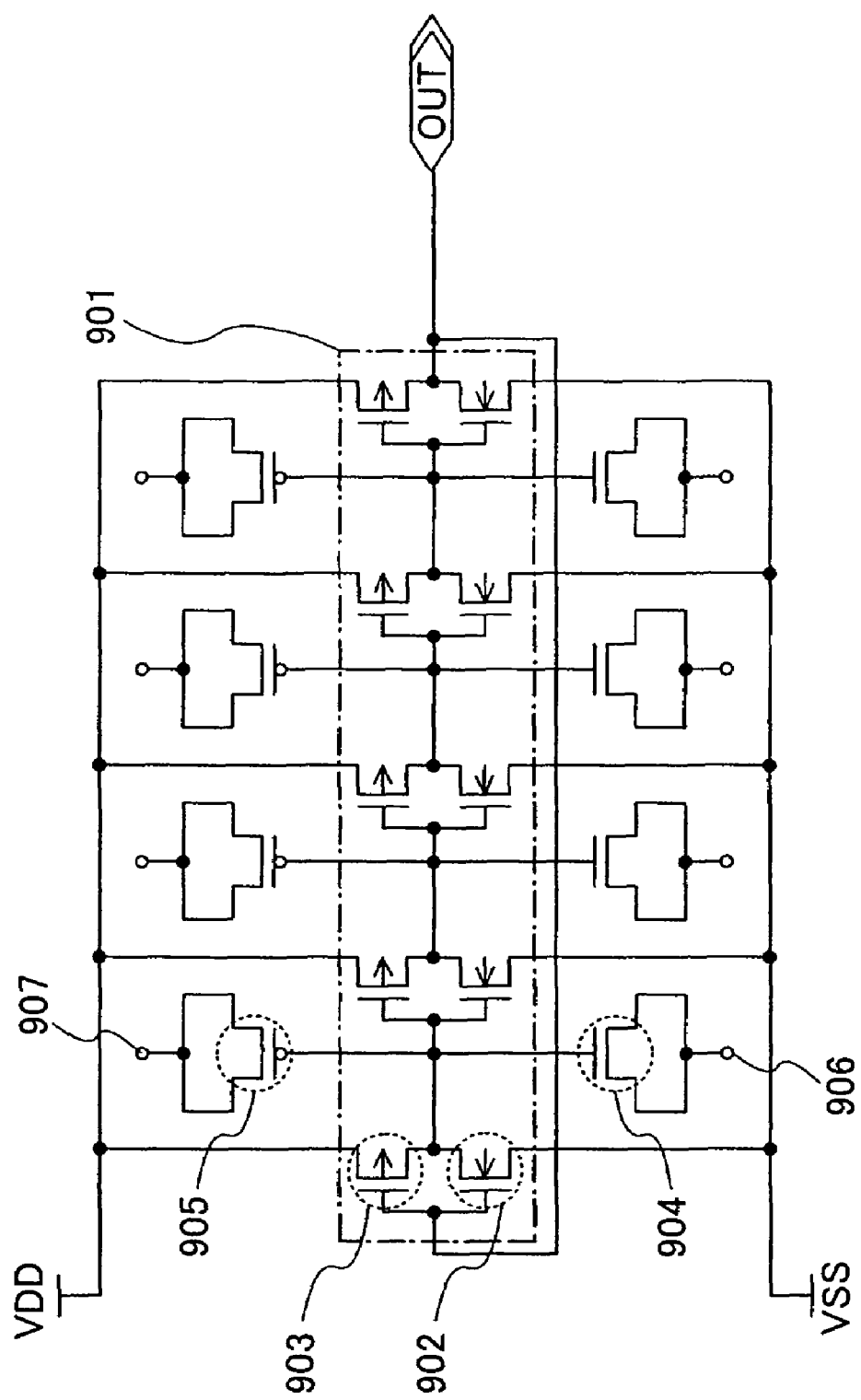
FIG. 9 illustrates a configuration of Embodiment Mode 2 of the invention.

FIG. 9 shows a circuit diagram in which a capacitor serving as a load is added to each stage of the inverter which forms the ring oscillator in Embodiment Mode 1 shown in FIG. 1.

In FIG. 9, in a ring oscillator 901, an inverter structure in which an N-channel transistor 902 and a P-channel transistor 903 are connected in series and gates of the two transistors are connected is included; a load structure in which gate terminals of an N-channel MOS transistor 904 and a P-channel MOS transistor 905 are connected to an output terminal of the inverter; and a plurality of combination of the inverter and the load are included when this combination of the inverter and the load is considered as one unit. The plurality of inverters has a loop structure in which an input terminal of a later stage and an output terminal of a previous stage are connected and an output terminal of the last stage is connected to an input terminal of a first stage. Note that in order to oscillate a signal from an oscillation circuit, it is necessary that the number of the inverters in the loop of the ring oscillator be an odd number. Note also that although the ring oscillator 901 in FIG. 9 has a five-stage structure (five units), needless to say, the invention is not limited to this. Frequency of an oscillation signal obtained by the ring oscillator is determined by characteristics of each inverter, a value of power supply voltage, and the number of stages. Accordingly, the number of stages of the inverters included in the ring oscillator is determined by comprehensively considering these factors.

Figure 4:
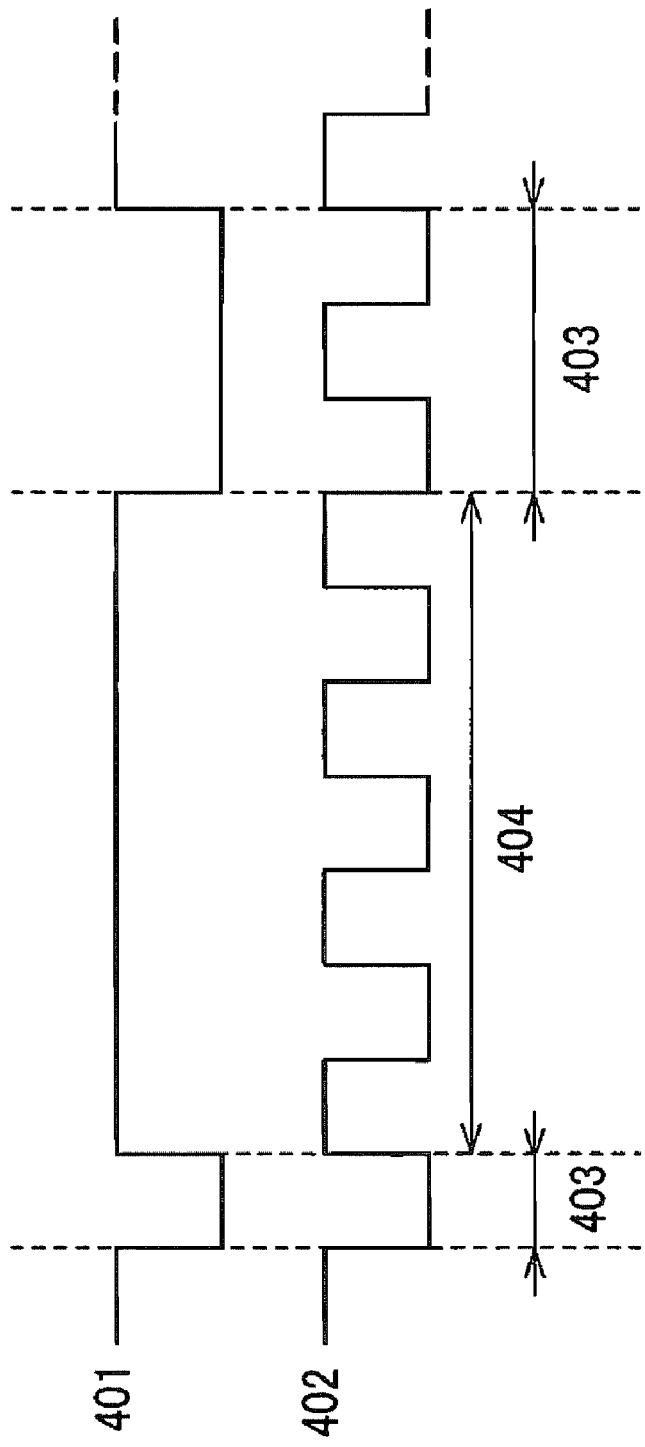
FIG. 4 illustrates an operation of a conventional PLL.

The MOS transistors 904 and 905 in each of which capacitance is formed between a gate terminal, and a source terminal and a drain terminal by connecting the source terminal and the drain terminal of the MOS transistor are added to each stage in addition to the basic configuration in which the inverters are connected in series with a loop shape, which is different from the configuration of the ring oscillator in FIG. 4 described in Embodiment Mode 1.

A MOS capacitor in the MOS transistors 904 and 905 added as the configuration in FIG. 9 which is different from that of FIG. 4 forms large capacitance between the gate terminal and a channel when the channel is formed. In this embodiment mode, this capacitance is utilized as a load for the inverter of each stage.

One of terminals of the MOS capacitor in each of the MOS transistors 904 and 905 added as the configuration in FIG. 9 which is different from that of FIG. 1 is connected to a node of the ring oscillator and a voltage applied to the other terminals 906 and 907 is controlled, so that capacitance serving as a load can be varied. Accordingly, signal propagation delay of the inverter can be varied.

Figure 10:
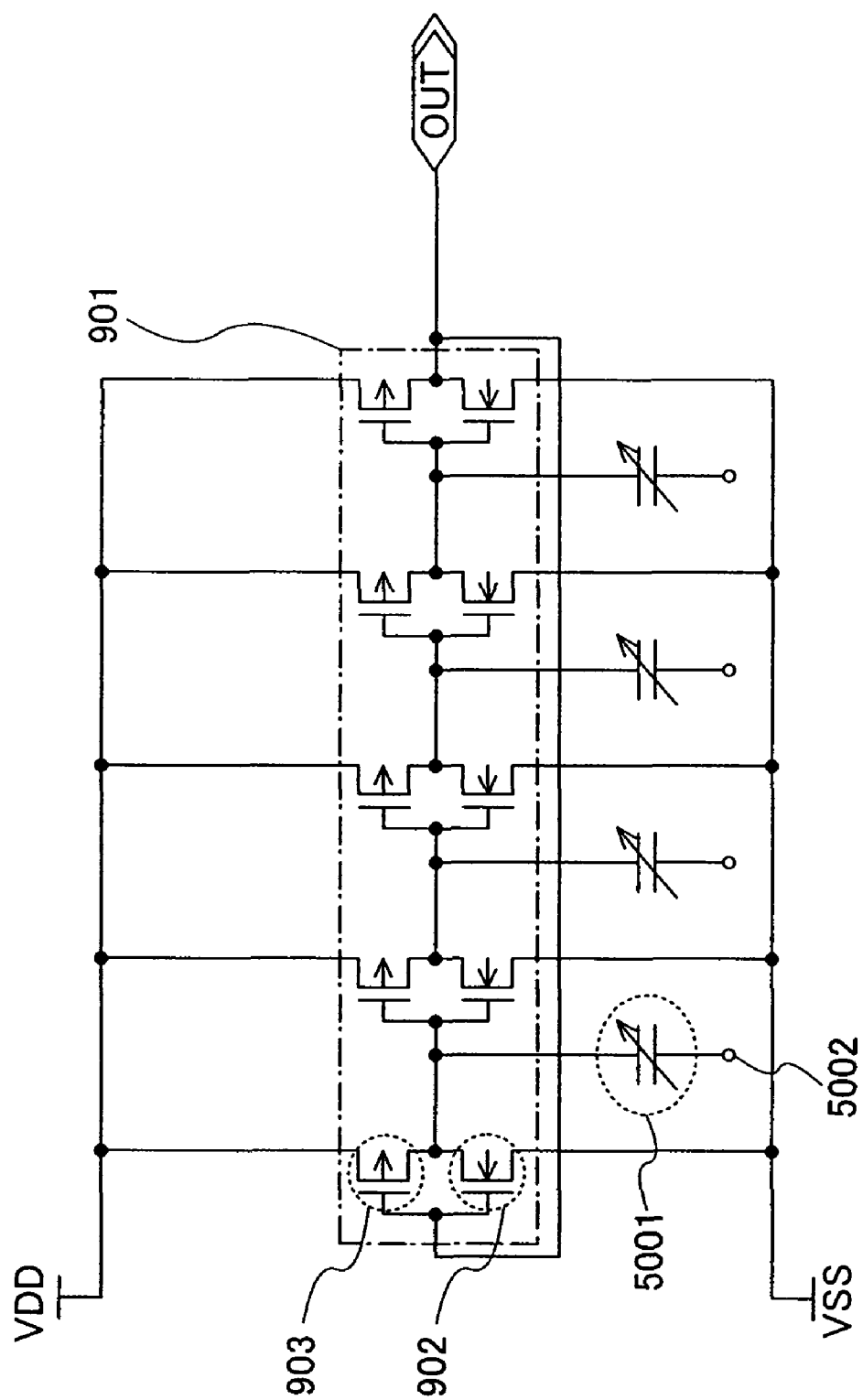
FIG. 10 illustrates a configuration of Embodiment Mode 2 of the invention.

Note that any element can be used as long as oscillation frequency of the ring oscillator can be changed by connecting an element in which capacitance is varied not limiting the MOS capacitor in this embodiment mode. A structure where a variable capacitor is connected may be used. FIG. 10 shows a structure where a variable capacitor is provided instead of MOS capacitance. In FIG. 10, a variable capacitor 5001 is provided instead of the MOS transistors 904 and 905 for obtaining MOS capacitance, which is different from FIG. 9. The variable capacitor 5001 is an element which varies capacitance by a voltage input from one terminal 5002 of the variable capacitor.

Note that by connecting the MOS capacitor to each stage of the inverter which forms the ring oscillator as shown in FIG. 9 or by connecting a variable capacitor to each stage of the inverter which forms the ring oscillator as shown in FIG. 10, oscillation frequency of the ring oscillator can be varied in a plurality of stages. By employing such a configuration, oscillation frequency of the ring oscillator can be controlled so that an adverse effect of characteristic variation in each element which forms the circuit can be canceled.

Thus, by employing the configuration of the ring oscillator in this embodiment mode, a semiconductor device can be provided in which oscillation frequency can be controlled as well as a malfunction such as an incorrect operation or no response is prevented and information stored in the memory circuit can be exactly transmitted, which are advantageous effects of the configuration shown in Embodiment Mode 1.

Note that this embodiment mode can be freely combined with any description in another embodiment mode and other embodiments in this specification.

Embodiment 1

In recent years, a small semiconductor device in which a microminiature IC chip is combined with an antenna for wireless communication (hereinafter referred to as a wireless chip) has attracted attention. By transmitting and receiving a communication signal (an operation magnetic field) using a wireless communication device (hereinafter referred to as a reader/writer), data can be written or read to/from a wireless chip.

As an application field of a wireless chip, for example, merchandise management in the distribution industry can be given. A merchandise management system using a bar code is the mainstream at present; however, since a bar code is read optically, data cannot be read when there is an interrupting object. On the other hand, in the case of a wireless chip, data is read wirelessly so that data can be read even when there is an interrupting object. Therefore, improvement in efficiency, cost reduction, and the like of merchandise management are expected. In addition, a wide range of applications including a railway ticket, an airplane ticket, automatic fare payment, and the like is expected.

As an application field of a wireless chip is expanding, a higher-performance wireless chip is increasingly required. For example, it is expected that data leakage to a third party be prevented by encryption of transmitted and received data. In order to achieve this, there are methods of performing encryption/decryption processing using hardware, software, and both hardware and software. In the method of processing using hardware, an arithmetic circuit includes a circuit dedicated for encryption/decryption. In the method of processing using software, an arithmetic circuit includes a CPU (Central Processing Unit) and a large capacity memory and the CPU executes an encryption/decryption program. In the method of processing using both hardware and software, an arithmetic circuit includes a dedicated circuit, a CPU, and a memory; the dedicated circuit performs a part of arithmetic processing of encryption/decryption, and the CPU executes a program of the rest of arithmetic processing. In each case, it is necessary that a wireless chip be provided with a large capacity memory. By employing the invention, a malfunction such as an incorrect operation or no response in accordance with generation of a clock signal is prevented and information stored in the memory circuit can be exactly transmitted.

Figure 22:
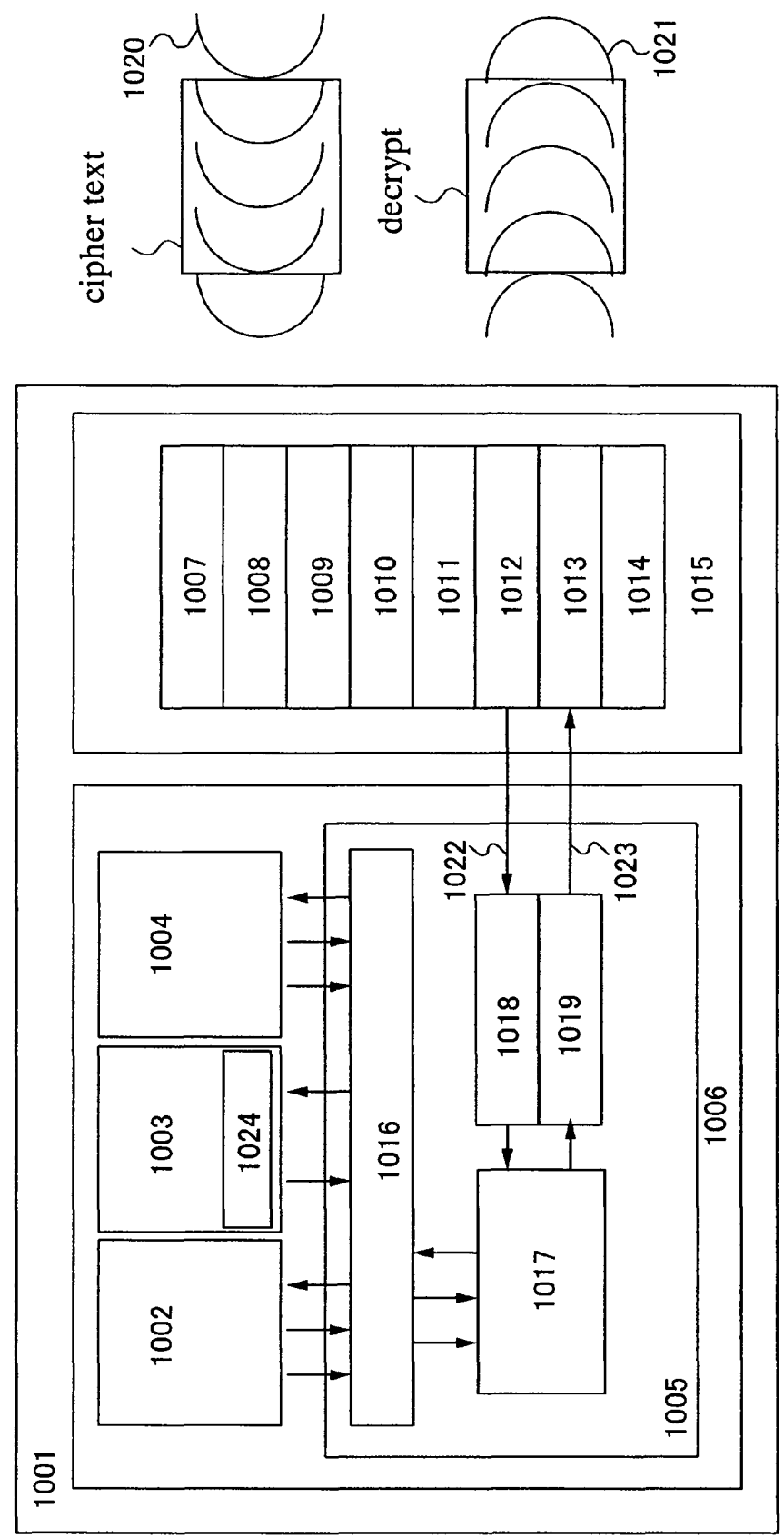
FIG. 22 illustrates a configuration of Embodiment 1 using the invention.
Figure 23:
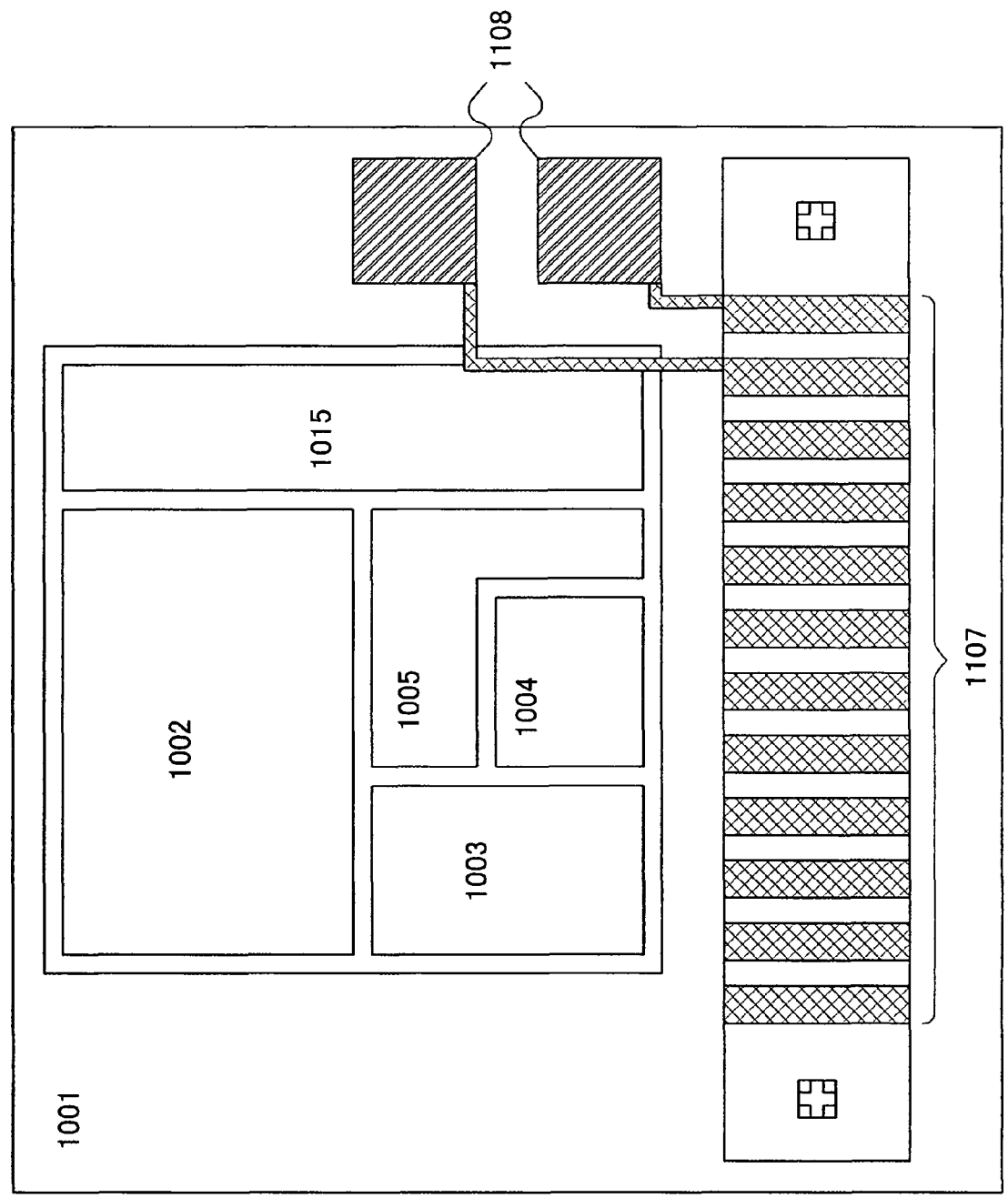
FIG. 23 illustrates a configuration of Embodiment 1 using the invention.

In this embodiment, a wireless chip having a coding processing function as an example of the semiconductor device in the invention is described with reference to FIGS. 22 and 23. FIG. 22 is a block diagram of the wireless chip and FIG. 23 is a layout diagram of the wireless chip.

First, a block structure of the wireless chip is described with reference to FIG. 22. In FIG. 22, a wireless chip 1001 includes an arithmetic circuit 1006 and an analog portion 1015. The arithmetic circuit 1006 includes a CPU 1002, a ROM 1003, a RAM 1004, and a controller 1005. The analog portion 1015 includes an antenna 1007, a resonance circuit 1008, a power supply circuit 1009, a reset circuit 1010, a clock generation circuit 1011, a demodulation circuit 1012, a modulation circuit 1013, and a power supply management circuit 1014. The controller 1005 includes a CPU interface (CPUIF) 1016, a control register 1017, a code extraction circuit 1018, and an encoding circuit 1019. Note that although FIG. 22 shows a communication signal by dividing it into a received signal 1020 and a transmitted signal 1021 for simplification, the received signal 1020 and the transmitted signal 1021 are actually integrated signals and transmitted and received between the wireless chip 1001 and a reader/writer at the same time. The received signal 1020 is demodulated by the demodulation circuit 1012 after being received by the antenna 1007 and the resonance circuit 1008. In addition, the transmitted signal 1021 is transmitted from the antenna 1007 after being modulated by the modulation signal 1013.

In FIG. 22, when the wireless chip 1001 is set in a magnetic field formed by the communication signal, induced electromotive force is generated by the antenna 1007 and the resonance circuit 1008. The induced electromotive force is held by an electric capacitor in the power supply circuit 1009, and a potential thereof is stabilized by the electric capacitor and supplied to each circuit in the wireless chip 1001 as a power supply voltage. The reset circuit 1010 generates an initial reset signal of the whole wireless chip 1001. For example, a signal which rises after increase in the power supply voltage is generated as a reset signal. The clock generation circuit 1011 changes frequency and a duty ratio of a clock signal in accordance with a control signal generated by the power supply management circuit 1014. The demodulation circuit 1012 detects a change in amplitude of the received signal 1020 of an ASK method as received data 1022 of "0"/"1". The demodulation circuit 1012 is, for example, a low-pass filter. Further, the modulation circuit 1013 transmits transmitted data by changing amplitude of the transmitted signal 1021 of an ASK method. For example, in the case where transmission data 1023 is "0", the resonance point of the resonance circuit 1008 is changed so that the amplitude of the communication signal is changed. The power supply management circuit 1014 monitors a power supply voltage supplied to the arithmetic circuit 1006 from the power supply circuit 1009 or current consumption in the arithmetic circuit 1006. The clock generation circuit 1011 generates a control signal for changing frequency and the duty ratio of the clock signal.

An operation of the wireless chip in this embodiment is described. First, the wireless chip 1001 receives the received signal 1020 including cipher text data from the reader/writer. The received signal 1020 is demodulated by the demodulation circuit 1012 and then divided by the code extraction circuit 1018 into a control command, cipher text data, and the like, which are subsequently stored in the control register 1017. Here, the control command is data which specifies response of the wireless chip 1001. For example, transmission of a unique ID number, operation stop, decryption, and the like are specified. Here, a control command of decryption is to be received.

Subsequently, in the arithmetic circuit 1006, the CPU 1002 decodes (decrypts) the cipher text by using a secret key 1024 stored in the ROM 1003 in advance in accordance with a code decoding program stored in the ROM 1003. The decrypted cipher text (decrypted text) is stored in the control register 1017. At this time, the RAM 1004 is used as a data storage region. The CPU 1002 accesses the ROM 1003, the RAM 1004, and the control register 1017 through the CPU interface 1016. The CPU interface 1016 has a function of generating an access signal for any of the ROM 1003, the RAM 1004, and the control register 1017 based on an address required by the CPU 1002.

Finally, the encoding circuit 1019 generates the transmission data 1023 from the decrypted text, which is modulated in the modulation circuit 1013. Next, the transmitted signal 1021 is transmitted to the reader/writer from the antenna 1007.

Note that although a processing method using software, that is, a method in which the arithmetic circuit includes the CPU and the large capacity memory and a program is executed by the CPU is described as the arithmetic method in this embodiment, an optimum arithmetic method can be selected in accordance with a purpose to form the arithmetic circuit based on the selected method. For example, as the arithmetic method, there are a method of processing arithmetic using hardware and a method of processing arithmetic using hardware in combination with software. In the method using hardware, it is only necessary that an arithmetic circuit include a dedicated circuit. In the method using hardware in combination with software, it is only necessary that an arithmetic circuit include a dedicated circuit, a CPU, and a memory, a part of arithmetic processing be carried out by the dedicated circuit, and a program of the rest of arithmetic processing be executed by the CPU.

Next, a layout structure of the wireless chip is described with reference to FIG. 23. In FIG. 23, portions corresponding to those in FIG. 22 are denoted by the same reference numerals and description thereof is omitted.

In FIG. 23, an FPC pad 1107 is an electrode pad group which is used when an FPC (Flexible Printed Circuit) is attached to the wireless chip 1001. An antenna bump 1108 is an electrode pad for attaching an antenna (not shown). When the antenna is attached, there is a possibility that excessive pressure be applied to the antenna bump 1108. Therefore, it is preferable that components which form circuits, such as a transistor, be not provided below the antenna bump 1108.

It is effective to use the FPC pad 1107 mainly for failure analysis. Since the wireless chip obtains power supply voltage from the communication signal, for example, the arithmetic circuit does not operate at all when a defect occurs in the antenna or the power supply circuit. Thus, failure analysis becomes extremely difficult. However, the arithmetic circuit can be operated by supplying power supply voltage from the FPC to the wireless chip 1001 through the FPC pad 1107 and inputting an optional electric signal instead of an electric signal supplied from the antenna. Therefore, failure analysis can be performed effectively.

Further, it is more effective to provide the FPC pad 1107 at a position where measurement using a prober can be performed. That is, by providing an electrode pad in accordance with a pitch of a prober needle in the FPC pad 1107, measurement by a prober can be performed. By using the prober, the number of steps for attaching the FPC at failure analysis can be reduced. In addition, since measurement can also be performed in a condition where a plurality of wireless chips are formed over a substrate, the number of steps for dividing into wireless chips can also be reduced. At mass production, the wireless chips can be inspected just before a step of attaching the antennas. Therefore, defective items can be sorted out at an early stage of the steps, so that production cost can be reduced.

Note that this embodiment mode can be freely combined with any description in the aforementioned embodiment modes. That is, by employing the invention, a semiconductor device can be provided in which a malfunction such as an incorrect operation or no response in accordance with generation of a clock signal is prevented and information stored in the memory circuit can be exactly transmitted.

Embodiment 2

In this embodiment, a method for manufacturing the wireless chip shown in the aforementioned embodiment is described. Each circuit which forms the wireless chip of the invention can be manufactured by a thin film transistol. This embodiment shows a method for manufacturing a flexible wireless chip by forming each circuit which forms the wireless chip by a thin film transistor and reprinting a circuit on a flexible substrate from a substrate which is used for manufacturing of the thin film transistor.

In this embodiment, a P-channel TFT (also described as a Pch-TFT) and an N-channel TFT (also described as an Nch-TFT) which form an inverter or the like, and an antenna over the thin film transistor are typically shown as a circuit which forms the wireless chip. Hereinafter, the method for manufacturing the wireless chip is described with reference to cross-sectional views shown in FIGS. 11A to 13B.

First, a release layer 1303 is formed over one surface of a substrate 1301 with an insulating film 1302 interposed therebetween. Sequentially, an insulating film 1304 functioning as a base film and a semiconductor film 1305 (e.g., a film including amorphous silicon) are stacked (see FIG. 11A). Note that the insulating film 1302, the release layer 1303, the insulating film 1304, and the amorphous semiconductor film 1305 can be sequentially formed.

The substrate 1301 is selected from a glass substrate, a quartz substrate, a metal substrate (e.g., a stainless steel substrate or a ceramic substrate, or the like), a semiconductor substrate such as a Si substrate, and the like. In addition, a substrate made of polyethylene terephthalate (PET), polyethylene naphthalate (PEN), polyether sulfone (PES), acryl, or the like can be selected as a plastic substrate. Note that the release layer 1303 is provided over the entire surface of the substrate 1301 with the insulating film 1302 interposed therebetween; however, if necessary, the release layer 1303 may be selectively provided by photolithography after the release layer 1303 is formed over the entire surface of the substrate 1301.

The insulating film 1302 and the insulating film 1304 are formed by using an insulating material such as silicon oxide, silicon nitride, silicon oxynitride ($SiO_xN_y$) (x>y>0), or silicon nitride oxide ($SiN_xO_y$) (x>y>0) by CVD, sputtering, or the like. For example, in the case where each of the insulating films 1302 and 1304 is formed to have a two-layer structure, a silicon nitride oxide film may be formed as a first layer, and a silicon oxynitride film may be formed as a second layer. Alternatively, a silicon nitride film may be formed as the first layer and a silicon oxide film may be formed as the second layer. The insulating film 1302 functions as a blocking layer which prevents an impurity element from being mixed into the release layer 1303 or an element formed thereover from the substrate 1301. The insulating film 1304 functions as a blocking layer which prevents an impurity element from being mixed into an element formed over the release layer 1303 from the substrate 1301 and the release layer 1303. By forming the insulating films 1302 and 1304 which function as the blocking layers, the case can be prevented in which alkaline metal such as Na or alkaline earth metal from the substrate 1301 and an impurity element included in the release layer 1303 adversely affect the element formed over the release layer 1303. Note that in the case where quartz is used as the substrate 1301, the insulating films 1302 and 1304 may be omitted.

A metal film, a stacked-structure of a metal film and a metal oxide film, or the like can be employed as the release layer 1303. The metal film is formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium(Rh), palladium (Pd), osmium (Os), and iridium (Ir), or an alloy material or a compound material which includes any of these elements as a main component, and has a single-layer structure or a stacked-layer structure. In addition, these materials can be formed by using sputtering, various kinds of CVD such as plasma CVD, or the like. In order to obtain the stacked-structure of the metal film and the metal oxide film, plasma treatment under oxygen atmosphere or $N_2O$ atmosphere is performed or thermal treatment under oxygen atmosphere or $N_2O$ atmosphere is performed after the aforementioned metal film is formed, and thus oxide or oxynitride of the metal film can be provided on a surface of the metal film. For example, in the case of providing a tungsten film by sputtering, CVD, or the like as the metal film, plasma treatment is performed to the tungsten film so that a metal oxide film which is formed of tungsten oxide can be provided on a surface of the tungsten film. In this case, tungsten oxide is denoted by $WO_x$, where x is 2 to 3. There are cases where x is 2 ($WO_2$), x is 2.5 ($W_2O_5$), x is 2.75 ($W_4O_{11}$), x is 3 ($WO_3$), and the like. In forming tungsten oxide, a value of x is not limited to the aforementioned examples, and thus, which kind of oxide is to be formed may be determined based on the etching rate or the like. In addition, for example, after forming a metal film (e.g., tungsten), metal oxide may be formed over the metal film (e.g., tungsten oxide may be formed over tungsten) at the same time as an insulating film of silicon oxide ($SiO_2$) or the like is formed over the metal film by sputtering. Further, high-density plasma treatment may be performed as plasma treatment. Metal nitride or metal oxynitride may be used in addition to the metal oxide film. In this case, plasma treatment or thermal treatment may be performed to the metal film under nitrogen atmosphere or nitrogen and oxygen atmosphere.

The amorphous semiconductor film 1305 is formed to have a thickness of 25 to 200 nm (preferably, 30 to 150 nm) by sputtering, LPCVD, plasma CVD, or the like.

Next, the amorphous semiconductor film 1305 is irradiated with a laser beam to be crystallized. Note that the amorphous semiconductor film 1305 may be crystallized by a method in which laser beam irradiation is combined with thermal crystallization using a RTA or an annealing furnace or thermal crystallization using a metal element which promotes crystallization. After that, a crystalline semiconductor film obtained is etched into a desired shape to form crystalline semiconductor films 1305a to 1305f, and a gate insulating film 1306 is formed so as to cover the crystalline semiconductor films 1305a to 1305f (see FIG. 11B).

The gate insulating film 1306 is formed by using an insulating material such as silicon oxide, silicon nitride, silicon oxynitride ($SiO_xN_y$) (x>y>0), or silicon nitride oxide ($SiN_xO_y$) (x>y>0) by CVD, sputtering, or the like. For example, in the case where the gate insulating film 1306 is formed to have a two-layer structure, a silicon nitride oxide film may be formed as a first layer, and a silicon oxynitride film may be formed as a second layer. Alternatively, a silicon nitride film may be formed as the first layer and a silicon oxide film may be formed as the second layer.

An example of manufacturing steps of the crystalline semiconductor films 1305a to 1305f is briefly described below. First, an amorphous semiconductor film having a film thickness of 50 to 60 nm is formed by plasma CVD. Next, a crystalline semiconductor film is formed by performing dehydrogenation treatment (500° C., 1 hour) and thermal crystallization treatment (550° C., 4 hours) to the amorphous semiconductor film after a solution including nickel which is a metal element for promoting crystallization is held over the amorphous semiconductor film. After that, the crystalline semiconductor films 1305a to 1305f are formed by being irradiated with a laser beam and using photolithography. Note that the amorphous semiconductor film may also be crystallized only by irradiation with a laser beam without performing thermal crystallization using a metal element which promotes crystallization.

As a laser oscillator which is used for crystallization, a continuous wave laser beam (a CW laser beam) or a pulsed laser beam can be used. As a laser beam which can be used here, laser beams which are emitted from one or a plurality of laser beams from a gas laser such as an Ar laser, a Kr laser, or an excimer laser, a laser using a medium in which one or a plurality of elements of Nd, Yb, Cr, Ti, Ho, Er, Tm, and Ta is added as a dopnat into single crystals of YAG, $YVO_4$, forsterite ($Mg_2SiO_4$), $YAlO_3$, or $GdVO_4$, or polycrystals (ceramic) of YAG, $Y_2O_3$, $YVO_4$, $YAlO_3$, or $GdVO_4$, a glass laser, a ruby laser, an alexandrite laser, a Ti:sapphire laser, a copper vapor laser, or a gold vapor laser can be given. By laser beam irradiation with a fundamental wave of such laser beam and a second harmonic wave to a fourth harmonic wave of the fundamental wave of such laser beam, a crystal having a large particle size can be obtained. For example, a second harmonic wave (532 nm) or a third harmonic wave (355 nm) of an Nd:$YVO_4$ laser (having a fundamental wave of 1064 nm) can be used. At this time, power density of the laser is required to be about 0.01 to 100 $MW/cm^2$ (preferably, 0.1 to 10 $MW/cm^2$). Irradiation is performed by setting the scan speed at about 10 to 200 cm/sec. Note that the laser using a medium in which one or a plurality of elements of Nd, Yb, Cr, Ti, Ho, Er, Tm, and Ta is added as a dopnat into single crystals of YAG, $YVO_4$, forsterite ($Mg_2SiO_4$), $YAlO_3$, or $GdVO_4$, or polycrystals (ceramic) of YAG, $Y_2O_3$, $YVO_4$, $YAlO_3$, or $GdVO_4$, an Ar ion laser, or the Ti:sapphire laser can be continuously oscillated, and can also be pulsed oscillated with a repetition rate of 10 MHz or more by performing a Q-switch operation, mode locking, or the like. When the laser beam is emitted with the repetition rate of 10 MHz or more, a semiconductor film is irradiated with the next pulse during the period in which the semiconductor film is melted by the laser beam and solidified. Accordingly, a solid-fluid interface can be continuously moved in the semiconductor film so that crystal grains which have grown continuously in the scan direction can be obtained, unlike the case of using a pulsed laser with a low repetition rate.

In addition, the gate insulating film 1306 may be formed by performing the aforementioned high-density plasma treatment to the semiconductor films 1305a to 1305f and oxidizing or nitriding surfaces thereof. For example, the gate insulating film 1306 is formed by plasma treatment with a mixed gas of noble gas such as He, Ar, Kr, or Xe, and oxygen, nitrogen oxide ($NO_2$), ammonia, nitrogen, or hydrogen. By performing excitation of plasma in this case with introduction of a microwave, plasma with a low electron temperature and high density can be generated. By oxygen radical (there is the case in which OH radical is included) or nitrogen radical (there is the case in which NH radical is included), the surface of the semiconductor films can be oxidized or nitrided.

By such treatment using high-density plasma, an insulating film of 1 to 20 nm, typically, 5 to 10 nm is formed over the semiconductor film. Since reaction in this case is solid-phase reaction, interface state density between the insulating film and the semiconductor films can be extremely lowered. Since such plasma treatment directly oxidizes (or nitrides) the semiconductor films (crystalline silicon or polycrystalline silicon), variation in the thickness of the insulating film which is formed can be extremely reduced, ideally. In addition, since oxidization is not strongly performed in the crystal grain boundary of crystalline silicon, an extremely preferable state is obtained. That is, by solid-phase oxidizing the surface of the semiconductor film by plasma treatment shown here, an insulating film with excellent uniformity and low interface state density can be formed without unusual oxidizing reaction in the crystal grain boundary.

Only an insulating film formed by high-density plasma treatment may be used for the gate insulating film, or an insulating film such as silicon oxide, silicon oxynitride, or silicon nitride may be deposited to be stacked thereover by CVD utilizing plasma or thermal reaction. In any case, in a transistor which is formed to include an insulating film formed by high-density plasma treatment in a part or all of a gate insulating film, characteristic variation can be reduced.

In addition, in the semiconductor films $1305a$ to $1305f$ which are obtained by scanning in one direction to be crystallized while the semiconductor films are irradiated with a continuous wave laser or laser beam which is emitted with a repetition rate of 10 MHz or more, characteristics such that crystals grow in a scan direction of the beam exist. A transistor is arranged by adjusting the scan direction to a channel length direction (a direction in which a carrier flows when a channel formation region is formed) and the gate insulating layer is combined with the transistor, so that a thin film transistor (a TFT) with little characteristic variation and high field effect mobility can be obtained.

Next, a first conductive film and a second conductive film are stacked over the gate insulating film $1306$. Here, the first conductive film is formed to have a thickness of 20 to 100 nm by CVD, sputtering, or the like. The second conductive film is formed to have a thickness of 100 to 400 nm. The first conductive film and the second conductive film are formed of an element selected from tantalum (Ta), tungsten (W), titanium (Ti), molybdenum (Mo), aluminum (Al), copper (Cu), chromium (Cr), niobium (Nb), and the like, or an alloy material or a compound material which includes any of these elements as a main component. Alternatively, the first conductive film and the second conductive film are formed of a semiconductor material typified by polycrystalline silicon doped with an impurity element such as phosphorus. As an example of a combination of the first conductive film and the second conductive film, a tantalum nitride film and a tungsten film, a tungsten nitride film and a tungsten film, a molybdenum nitride film and a molybdenum film, or the like can be given. Since tungsten and tantalum nitride have high thermal resistance, thermal treatment aimed at thermal activation can be performed after the first conductive film and the second conductive film are formed. In addition, in the case of a three-layer structure, a stacked-layer structure of a molybdenum film, an aluminum film, and a molybdenum film may be employed.

Next, a resist mask is formed by photolithography and a gate electrode $1307$ is formed above each of the semiconductor films $1305a$ to $1305f$ by performing etching for forming the gate electrode and a gate line. Here, an example in which a stacked-layer structure of a first conductive film $1307a$ and a second conductive film $1307b$ is provided as the gate electrode $1307$ is shown.

Next, an impurity element which imparts n-type conductivity with low concentration is introduced into the semiconductor films $1305a$ to $1305f$ by using the gate electrode as a mask by ion doping or ion implantation, and then, the resist mask is selectively formed by photolithography and an impurity element which imparts p-type conductivity with high concentration is introduced into the semiconductor films $1305a$ to $1305f$. As an impurity element which imparts n-type conductivity, phosphorus (P), arsenic (As), or the like can be used. As an impurity element which imparts p-type conductivity, boron (B), aluminum (Al), gallium (Ga), or the like can be used. Here, phosphorus (P) is used as the impurity element which imparts n-type conductivity, and phosphorus (P) is selectively introduced to the semiconductor films $1305a$ to $1305f$ so as to be included therein with a concentration of $1\times10^{15}$ to $1\times10^{19}/\text{cm}^3$ to form an impurity region $1308$ having n-type conductivity. Further, boron (B) is used as the impurity element which imparts p-type conductivity, and boron (B) is selectively introduced into the semiconductor films $1305c$ and $1305e$ so as to be included therein with a concentration of $1\times10^{19}$ to $1\times10^{20}/\text{cm}^3$ to form an impurity region $1309$ which imparts p-type conductivity (see FIG. 11C).

Sequentially, an insulating film is formed so as to cover the gate insulating film $1306$ and the gate electrode $1307$. The insulating film is formed with a single-layer structure or a stacked-layer structure of a film including an inorganic material such as silicon, silicon oxide, or silicon nitride, or a film including an organic material such as an organic resin by plasma CVD, sputtering, or the like. Next, the insulating film is selectively etched by anisotropic etching which is based on a perpendicular direction to form an insulating film $1310$ (also described as a sidewall) which is in contact with a side of the gate electrode $1307$. The insulating film $1310$ is used as a doping mask when a LDD (Lightly Doped Drain) region is formed.

Sequentially, an impurity element which imparts n-type conductivity with high concentration is introduced into the semiconductor films $1305a$, $1305b$, $1305d$, and $1305f$ by using the resist mask, which is formed by photolithography as well as gate electrode $1307$ and the insulating film $1310$ as masks, and an impurity region $1311$ having n-type conductivity is formed. Here, phosphorus (P) is used as the impurity element which imparts n-type conductivity, and phosphorus (P) is selectively introduced into the semiconductor films $1305a$, $1305b$, $1305d$, and $1305f$ so as to be included therein with a concentration of $1\times10^{19}$ to $1\times10^{20}/\text{cm}^3$ to form the impurity region $1311$, the concentration of n-type impurity element of which is higher than that of the impurity region $1308$.

By the aforementioned steps, n-channel thin film transistors $1300a$, $1300b$, $1300d$, and $1300f$ and p-channel thin film transistors $1300c$ and $1300e$ are formed (see FIG 11D).

In the n-channel thin film transistor $1300a$, a channel formation region is formed in a region of the semiconductor film $1305a$ which overlaps with the gate electrode $1307$; the impurity region $1311$ which forms a source region or a drain region is formed in a region of the semiconductor film $1305a$ which does not overlap with the gate electrode $1307$ and the insulating film $1310$; and a low concentration impurity region (an LDD region) is formed in a region of the semiconductor film $1305a$ which overlaps with the insulating film $1307$ and between the channel formation region and the impurity region $1311$. Similarly, in each of the n-channel thin film transistors 1300b, 1300d, and 1300f, a channel formation region, a low concentration impurity region, and the impurity region 1311 are formed.

In the p-channel thin film transistor 1300c, a channel formation region is formed in a region of the semiconductor film 1305c which overlaps with the gate electrode 1307 and the impurity region 1309 which forms a source region or a drain region is formed in a region of the semiconductor film 1305a which does not overlap with the gate electrode 1307. Similarly, in the p-channel thin film transistor 1300e, a channel formation region and an impurity region 1309 are formed. Note that although an LDD region is not provided in each of the p-channel thin film transistors 1300c and 1300e here, an LDD region may be provided in each of the p-channel thin film transistors or a structure in which an LDD region is not provided in each of the n-channel thin film transistors may also be employed.

An insulating film is formed to have a single-layer structure or a stacked-layer structure so as to cover the semiconductor films 1305a to 1305f and the gate electrode 1307, and conductive films 1313 which are electrically connected to the impurity regions 1309 and 1311 which form the source regions or the drain regions of the thin film transistors 1300a to 1300f are formed over the insulating film (see FIG. 12A). The insulating film is formed to have the single-layer structure or the stacked-layer structure using an inorganic material such as silicon oxide or silicon nitride, an organic material such as polyimide, polyamide, benzocyclobutene, acryl, or epoxy, a siloxane material, or the like by CVD, sputtering, SOG, a droplet discharge method, a screen printing method, or the like. The insulating film is formed to have a two-layer structure, and a silicon nitride oxide film is formed as a first-layer insulating film 1312a and a silicon oxynitride film is formed as a second-layer insulating film 1312b. In addition, the conductive film 1313 can form the source regions or the drain regions of the thin film transistors 1300a to 1300f.

Note that thermal treatment aimed at recovery of crystallinity of the semiconductor films, activation of the impurity element which has been introduced into the semiconductor films, or hydrogenation of the semiconductor films may be performed before the insulating films 1312a and 1312b are formed or after one or a plurality of thin films of the insulating films 1312a and 1312b are formed. Thermal anneal, laser anneal, RTA, or the like may be applied to thermal treatment.

The conductive film 1313 is formed of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material which includes any of these elements as a main component, and has a single-layer structure or a stacked-layer structure. An alloy material which includes aluminum as a main component corresponds to a material which includes aluminum as a main component and includes nickel, or an alloy material which includes aluminum as a main component and includes nickel and one or both of carbon and silicon, for example. As the conductive film 1313, a stacked-layer structure of a barrier film, an aluminum silicon (Al—Si) film, and a barrier film or a stacked-layer structure of a barrier film, an aluminum silicon (Al—Si) film, a titanium nitride film, and a barrier film may be employed, for example. Note that the barrier film corresponds to a thin film formed of titanium, titanium nitride, molybdenum, or molybdenum nitride. Since aluminum and aluminum silicon have low resistance values and are inexpensive, aluminum and aluminum silicon are suitable for a material for forming the conductive film 1313. In addition, by providing the barrier films in an upper layer and a lower layer, generation of a hillock of aluminum or aluminum silicon can be prevented. Further, by forming a barrier film with titanium which is an element having a high reducing property, even when a thin natural oxide film is formed over the crystalline semiconductor films, the natural oxide film can be chemically reduced and an excellent contact with the crystalline semiconductor films can be obtained.

Next, an insulating film 1314 is formed so as to cover the conductive film 1313, and conductive films 1315a and 1315b which are each electrically connected to the conductive films 1313 which forms the source regions or the drain regions of the thin film transistors 1300a to 1300f are formed over the insulating film 1314. In addition, a conductive film 1306 which is electrically connected to the conductive film 1313 which forms the source region or the drain region of each of the thin film transistors 1300b and 1300e is formed. Note that the conductive films 1315a and 1315b and the conductive film 1306 may be formed by using the same material and at the same time. The conductive films 1315a and 1315b and the conductive film 1306 can be formed with any of the materials described for the conductive film 1313.

Sequentially, a conductive film 1317 functioning as an antenna is formed so as to be electrically connected to the conductive film 1306 (see FIG. 12B).

The insulating film 1314 can be provided to have a single-layer structure or a stacked-layer structure formed of an insulating film including oxygen or nitrogen such as silicon oxide ($SiO_x$), silicon nitride ($SiN_x$), silicon oxynitride ($SiO_xN_y$) (x>y), or silicon nitride oxide ($SiN_yO_x$) (x>y), a film including carbon such as DLC (diamond like carbon), an organic material such as epoxy, polyimide, polyamide, polyvinyl phenol, benzocyclobutene, or acryl, or a siloxane material such as a siloxane resin. Note that the siloxane material corresponds to a material including a Si—O—Si bond. Siloxane has a skeletal structure with the bond of silicon (Si) and oxygen (O). As a substituent, an organic group including at least hydrogen (e.g., an alkyl group or aromatic hydrocarbon) is used. As the substituent, a fluoro group can also be used. Alternatively, as the substituent, the organic group including at least hydrogen and the fluoro group may be used.

The conductive film 1317 is formed of a conductive material by using CVD, sputtering, a printing method such as a screen printing method or a gravure printing method, a droplet discharge method, a dispenser method, a metal plating method, or the like. The conductive material is formed of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material which includes any of these elements as a main component, and has a single-layer structure or a stacked-layer structure.

For example, in the case of forming the conductive film 1317 which functions as the antenna by using the screen printing method, the conductive layer 1317 can be provided by selectively printing a conductive paste where a conductive particle having a particle size of several nm to several ten μm is dissolved or dispersed in an organic resin. As the conductive particle, metal particles of one or more of silver (Ag), gold (Au), copper (Cu), nickel (Ni), platinum (Pt), palladium (Pd), tantalum (Ta), molybdenum (Mo), titanium (Ti), and the like, a fine particle of silver halide, or a dispersing nano particle can be used. In addition, as the organic resin included in the conductive paste, one or more selected from organic resins functioning as a binder, a solvent, a dispersive agent, and a coating member of the metal particles can be used. Typically, an organic resin such as an epoxy resin or a silicon resin can be given as an example of the organic resin included in the conductive paste. Further, in forming the conductive film, baking is preferably performed after the conductive paste is pushed out. For example, in the case of using a fine particle which includes silver as a main component (for example, a particle size is equal to or greater than 1 nm and equal to or less than 100 nm) as a material for the conductive paste, the conductive film can be obtained by baking it with temperatures in the range of 150 to 300° C. to cure. Further, a fine particle which includes solder or lead-free solder as a main component may also be used. In this case, it is preferable that a fine particle having a particle size of 20 μm or less be used. Solder or lead-free solder has an advantage such as low cost.

In addition, the conductive films 1315*a* and 1315*b* can function as wirings which are electrically connected to the battery included in the semiconductor device in the invention in a later step. In addition, when the conductive film 1317 functioning as the antenna is formed, a conductive film may be separately formed so as to be electrically connected to the conductive films 1315*a* and 1315*b* so that the conductive film is utilized as a wiring connected to the battery.

Next, after forming an insulating film 1318 so as to cover the conductive film 1317, a layer which includes the thin film transistors 1300*a* to 1300*f*, the conductive film 1317, and the like (hereinafter described as an element formation layer 1319) is peeled off the substrate 1301. Here, the element formation layer 1319 can be peeled off the substrate 1301 by using physical force after an opening portion is formed in a region excluding the thin film transistors 1300*a* to 1300*f* by laser beam irradiation (e.g., UV light) (see FIG. 12C). Alternatively, before peeling the element formation layer 1319 off the substrate 1301, the release layer 1303 may be selectively removed by introducing an etching agent into the opening portion formed. Gas or liquid including halogen fluoride or an interhalogen compound is used as the etching agent. For example, chlorine trifluoride ($ClF_3$) is used as the gas including halogen fluoride. Then, the element formation layer 1319 is in the condition that it is peeled off the substrate 1301. Note that the release layer 1303 may be partially left without being removed entirely. Therefore, consumption of the etching agent can be suppressed and a processing time which is necessary for removing the release layer can be shortened. In addition, the element formation layer 1319 can be held over the substrate 1301 even after the release layer 1303 is peeled off the substrate 1301. Further, by recycling the substrate 1301 from which the element formation layer 1319 is peeled, cost can be reduced.

The insulating film 1318 can be provided to have a single-layer structure or a stacked-layer structure formed of an insulating film including oxygen or nitrogen such as silicon oxide ($SiO_x$), silicon nitride ($SiN_x$), silicon oxynitride ($SiO_xN_y$) (x>y), or silicon nitride oxide ($SiN_yO_x$) (x>y), a film including carbon such as DLC (Diamond Like Carbon), an organic material such as epoxy, polyimide, polyamide, polyvinyl phenol, benzocyclobutene, or acryl, or a siloxane material such as a siloxane resin.

Figure 13A:
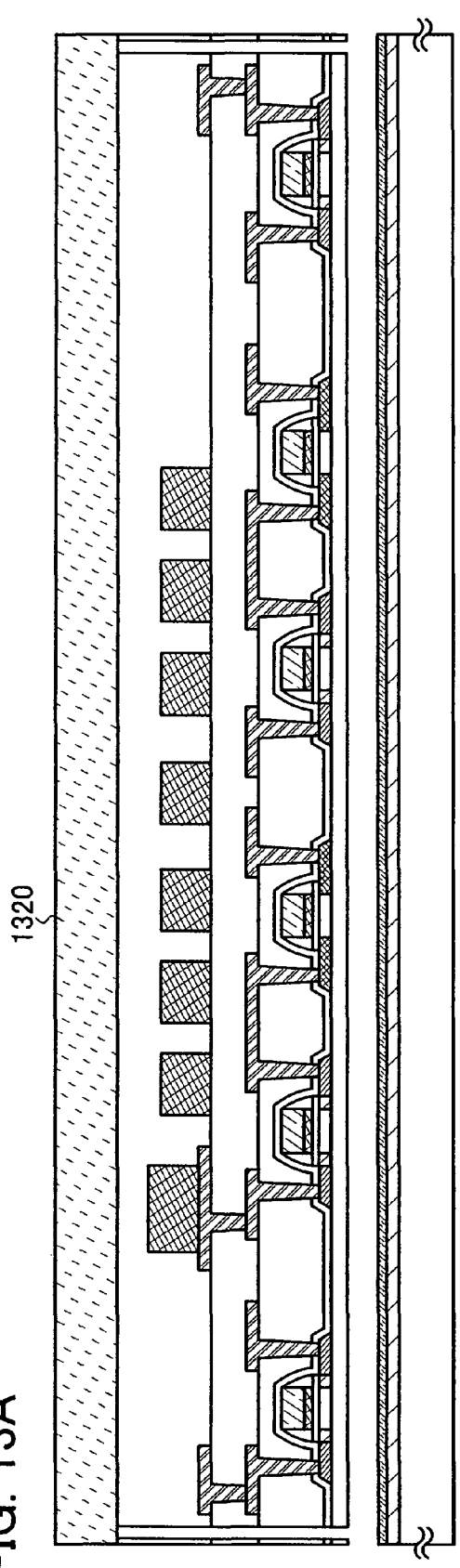
FIGS. 13A and 13B each illustrate a structure of Embodiment 2 using the invention.

In this embodiment, after forming an opening portion in the element formation layer 1319 by laser light irradiation, a first sheet material 1320 is attached to one surface of the element formation layer 1319 (a surface in which the insulating film 1318 is exposed), and then, the element formation layer 1319 is peeled off the substrate 1301 (see FIG. 13A).

Figure 13B:
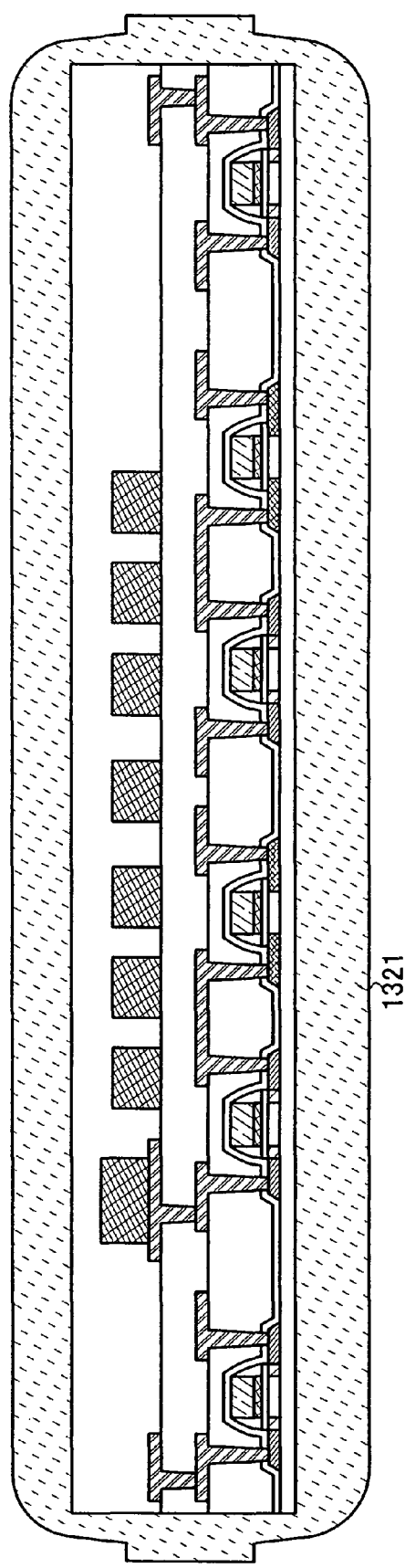

Next, the first sheet material 1320 is attached to the other surface of the element formation layer 1319 (a surface which is exposed by the peeling) by performing one or both of thermal treatment and pressure treatment after a second sheet material 1321 is attached (see FIG. 13B). As the first sheet material 1320 and the second sheet material 1321, a hot melt film or the like can be used.

As each of the first sheet material 1320 and the second sheet material 1321, each film to which countermeasures against static electricity is applied in order to prevent static electricity or the like (hereinafter described as an anitistatic film) can also be used. A film in which an antistatic material is dispersed in a resin, a film to which an antistatic material is attached, and the like can be given as examples of the antistatic film. As a film in which an antistatic material is provided, a film in which an antistatic material is provided on one surface may be employed, or a film in which an antistatic material is provided on opposite surfaces may be employed. In addition, the film in which the antistatic material is provided on one surface, a surface in which the antistatic material is provided may be attached to the element formation layer 1319 so as to be inside of the film, or may be attached to the element formation layer 1319 so as to be outside of the film. Note that the antistatic material may be provided on the entire surface or a part of the surface. Here, as the antistatic material, metal, indium tin oxide (ITO), and a surface active agent such as an ampholytic surface active agent, a cationic surface active agent, or a nonionic surface active agent can be used. Alternatively, as the antistatic material, a resin material including a cross-linking polymer which has a carboxyl group and quaternary ammonium base as a side chain or the like can also be used. By attaching these materials to the film, kneading these materials into the film, or applying these materials to the film, the antistatic film can be completed. By sealing the element formation layer 1319 with the antistatic film, the case where a semiconductor element is adversely affected by static electricity or the like from outside can be prevented when the semiconductor device is handled as a product.

Note that this embodiment mode can be freely combined with any description in the aforementioned embodiment modes. That is, by employing the invention, a semiconductor device can be provided in which a malfunction such as an incorrect operation or no response in accordance with generation of a clock signal is prevented and information stored in the memory circuit can be exactly transmitted.

Embodiment 3

In this embodiment, a method for manufacturing a wireless chip, which is different from that of the aforementioned embodiment, is described. The transistor in the invention can be formed of a MOS transistor formed over a single crystalline substrate as well as the thin film transistor formed over the insulating substrate described in the aforementioned embodiment.

In this embodiment, a p-channel TFT (also described as a Pch-TFT) and an n-channel TFT (also described as an Nch-TFT) which form an inverter or the like are typically shown as a circuit which forms the wireless chip. Hereinafter, the method for manufacturing the wireless chip is described with reference to cross-sectional views shown in FIGS. 14A to 16.

Figure 14A:
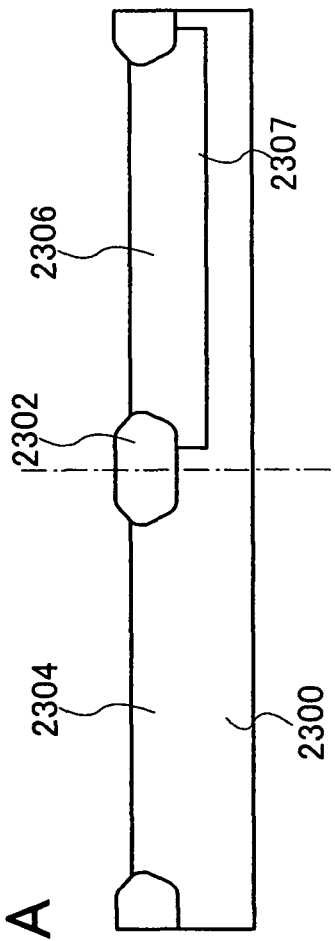
FIGS. 14A to 14C each illustrate a structure of Embodiment 3 using the invention.

First, separated element regions 2304 and 2306 (hereinafter also described as regions 2304 and 2306) are formed in a semiconductor substrate 2300 (see FIG. 14A). The regions 2304 and 2306 provided in the semiconductor substrate 2300 are separate from each other by an insulating film 2302 (also referred to as a field oxide film). Here, an example is described in which a single crystalline silicon substrate having n-type conductivity is used as the semiconductor substrate 2300 and a p-well 2307 is provided in the region 2306 of the semiconductor substrate 2300.

In addition, any substrate can be used as the substrate 2300 as long as it is a semiconductor substrate, without particularly limiting to a certain type. For example, a single crystalline silicon substrate having n-type or p-type conductivity, a compound semiconductor substrate (e.g., a GaAs substrate, an InP substrate, a GaN substrate, a SiC substrate, a sapphire substrate, or a ZnSe substrate), an SOI (Silicon On Insulator) substrate manufactured by using a bonding method or a SIMOX (Separation by Implanted Oxygen) method, or the like can be used.

For forming the separated element regions 2304 and 2306, a selective oxidation method (a LOCOS (Local Oxidation of Silicon) method), a trench isolation method, or the like can be used as appropriate.

Further, the p-well formed in the region 2306 of the semiconductor substrate 2300 can be formed by selectively introducing an impurity element having p-type conductivity into the semiconductor substrate 2300. As the impurity element having p-type conductivity, boron (B), aluminum (Al), gallium (Ga), or the like can be used.

Note that although an impurity element is not introduced into the region 2304 because a semiconductor substrate having n-type conductivity is used as the semiconductor substrate 2300 in this embodiment, an n-well may be formed in the region 2304 by introducing an impurity element which imparts n-type conductivity. As the impurity element which imparts n-type conductivity, phosphorus (P), arsenic (As), or the like can be used. On the other hand, in the case where a semiconductor substrate having p-type conductivity is used, an n-well may be formed in the region 2304 by introducing an impurity element which imparts n-type conductivity and no impurity element may be introduced into the region 2306.

Figure 14B:
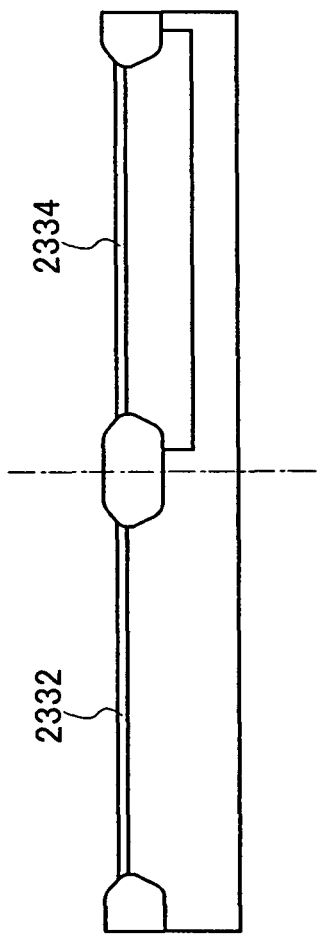

Next, insulating films 2332 and 2334 are formed so as to cover the regions 2304 and 2306, respectively (see FIG. 14B).

For example, each of the insulating films 2332 and 2334 can be formed of a silicon oxide film by oxidizing each surface of the regions 2304 and 2306 provided in the semiconductor substrate 2300 by performing heat treatment. Alternatively, each of the insulating films 2332 and 2334 may be formed of a stacked-layer structure of a silicon oxide film and a film including oxygen and nitrogen (a silicon oxynitride film) by forming the silicon oxide film using a thermal oxidation method and then nitriding the surface of the silicon oxide film by nitriding treatment.

Alternatively, the insulating films 2332 and 2334 may be formed using plasma treatment as described above. For example, by performing oxidizing treatment or nitriding treatment with high-density plasma treatment on the surfaces of the regions 2304 and 2306 provided in the semiconductor substrate 2300, silicon oxide ($SiO_x$) films or silicon nitride ($SiN_x$) films can be formed as the insulating films 2332 and 2334. In addition, after oxidizing treatment is performed on the surfaces of the regions 2304 and 2306 by high-density plasma treatment, nitriding treatment may be performed by performing high-density plasma treatment again. In this case, silicon oxide films are formed on the surfaces of the regions 2304 and 2306 and silicon oxynitride films are formed over the silicon oxide films, so that each of the insulating films 2332 and 2334 is formed to have a stacked-layer structure of the silicon oxide film and the silicon oxynitride film. Alternatively, after silicon oxide films are formed on the surfaces of the regions 2304 and 2306 by a thermal oxidation method, oxidizing treatment or nitriding treatment may be performed by high-density plasma treatment.

In addition, each of the insulating films 2332 and 2334 formed in the regions 2304 and 2306 of the semiconductor substrate 2300 functions as a gate insulating film in a transistor which is completed later.

Figure 14C:
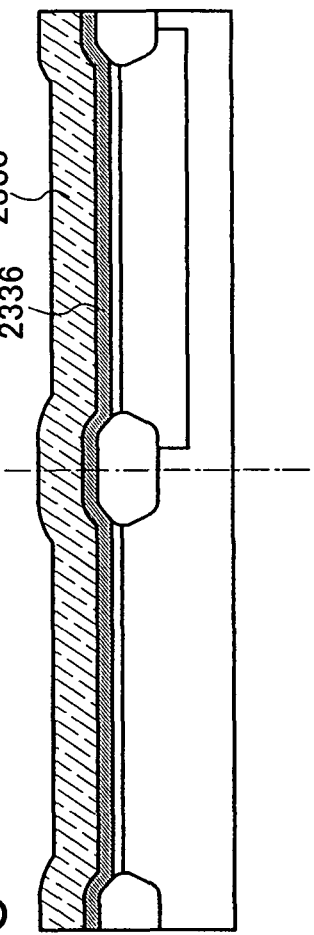

Next, a conductive film is formed so as to cover the insulating films 2332 and 2334 formed over the regions 2304 and 2306 (see FIG. 14C). Here, an example is shown in which a conductive film 2336 and a conductive film 2338 are sequentially stacked as the conductive film. Needless to say, the conductive film may be formed with a single-layer structure or a staked-layer structure having three or more layers.

Each of the conductive films 2336 and 2338 can be formed of an element selected from tantalum (Ta), tungsten (W), titanium (Ti), molybdenum (Mo), aluminum (Al), copper (Cu), chromium (Cr), niobium (Nb), and the like, or an alloy material or a compound material which includes any of these elements as a main component. Alternatively, each of the conductive films 2336 and 2338 can be formed of a metal nitride film obtained by nitriding any of these elements. Further alternatively, each of the conductive films 2336 and 2338 can be formed of a semiconductor material typified by polycrystalline silicon doped with an impurity element such as phosphorus.

Here, a stacked-layer structure is employed in which the conductive film 2336 is formed using tantalum nitride and the conductive film 2338 is formed using tungsten thereover. Alternatively, a single-layer or stacked-layer film of tungsten nitride, molybdenum nitride, or titanium nitride can be used as the conductive film 2336, and a single-layer or stacked-layer film of tantalum, molybdenum, or titanium can be used as the conductive film 2338.

Figure 15A:
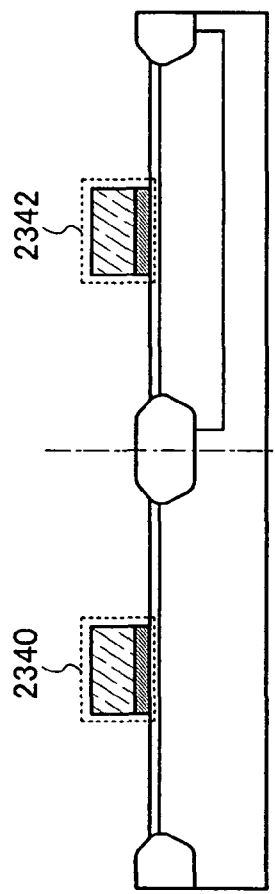
FIGS. 15A to 15C each illustrate a structure of Embodiment 3 using the invention.

Next, by selectively etching to remove the conductive films 2336 and 2338 which are stacked, the conductive films 2336 and 2338 are partially left over the regions 2304 and 2306 to form gate electrodes 2340 and 2342 (see FIG. 15A).

Figure 15B:
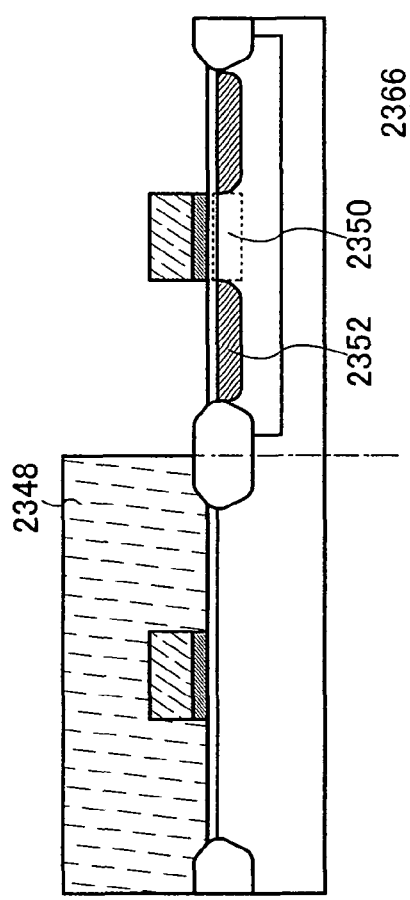

Next, a resist mask 2348 is selectively formed so as to cover the region 2304, and an impurity element is introduced into the region 2306 by using the resist mask 2348 and the gate electrode 2342 as masks, so that an impurity region is formed (see FIG. 15B). As the impurity element, an impurity element which imparts n-type conductivity or an impurity element which imparts p-type conductivity is used. As the impurity element which imparts n-type conductivity, phosphorus (P), arsenic (As), or the like can be used. As the impurity element which imparts p-type conductivity, boron (B), aluminum (Al), gallium (Ga), or the like can be used. Here, phosphorus (P) is used as the impurity element.

In FIG. 15B, by introducing the impurity element, an impurity region 2352 which forms a source region or a drain region and a channel formation region 2350 are formed in the region 2306.

Figure 15C:
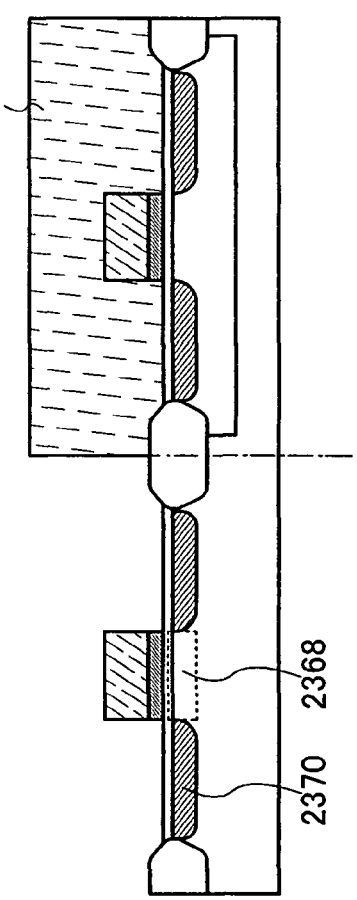
Figure 16:
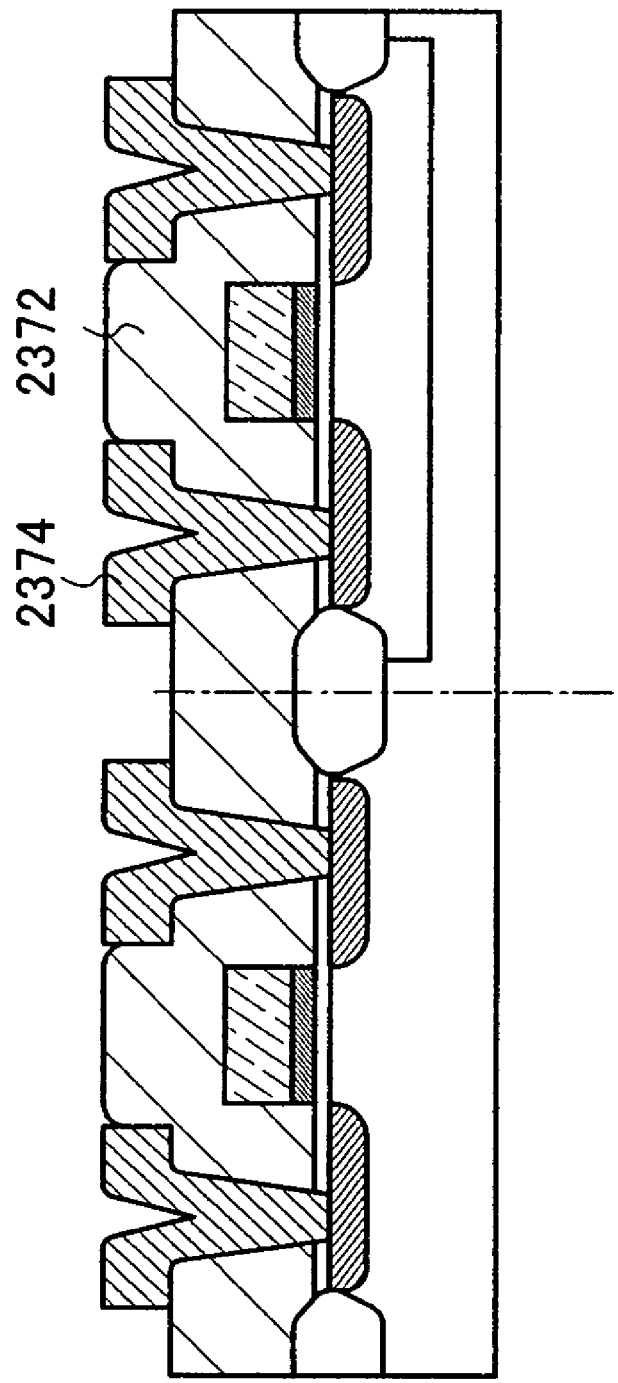
FIG. 16 illustrates a structure of Embodiment 3 using the invention.

Next, a resist mask 2366 is selectively formed so as to cover the region 2306, and an impurity element is introduced into the region 2304 by using the resist mask 2366 and the gate electrode 2340 as masks, so that an impurity region is formed (see FIG. 15C). As the impurity element, an impurity element which imparts n-type conductivity or an impurity element which imparts p-type conductivity is used. As the impurity element which imparts n-type conductivity, phosphorus (P), arsenic (As), or the like can be used. As the impurity element which imparts p-type conductivity, boron (B), aluminum (Al), gallium (Ga), or the like can be used. Here, an impurity element having a conductivity type which is different from that of the impurity element introduced into the region 2306 in FIG. 15C (e.g., boron (B)) is introduced. Accordingly, an impurity region 2370 which forms a source region or a drain region and a channel formation region 2368 are formed in the region 2304.

Next, second insulating films 2372 are formed so as to cover the insulating films 2332 and 2334, and the gate electrodes 2340 and 2342. A wiring 2374 which is electrically connected to the impurity regions 2352 and 2370 formed in the regions 2304 and 2306 respectively is formed over the second insulating film 2372 (see FIG. 16).

The second insulating film 2372 can be provided to have a single-layer structure or a stacked-layer structure formed of an insulating film including oxygen or nitrogen such as silicon oxide ($SiO_x$), silicon nitride ($SiN_x$), silicon oxynitride ($SiO_xN_y$) (x>y), or silicon nitride oxide ($SiN_yO_x$) (x>y), a film including carbon such as DLC (diamond like carbon), an organic material such as epoxy, polyimide, polyamide, polyvinyl phenol, benzocyclobutene, or acryl, or a siloxane material such as a siloxane resin. Note that the siloxane material corresponds to a material including a Si—O—Si bond. Siloxane has a skeletal structure with the bond of silicon (Si) and oxygen (O). As a substituent, an organic group including at least hydrogen (e.g., an alkyl group or aromatic hydrocarbon) is used. As the substituent, a fluoro group can also be used. Alternatively, as the substituent, the organic group including at least hydrogen and the fluoro group may be used.

The wiring 2374 is formed of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material which includes any of these elements as a main component, and has a single-layer structure or a stacked-layer structure. An alloy material which includes aluminum as a main component corresponds to a material which includes aluminum as a main component and includes nickel, or an alloy material which includes aluminum as a main component and includes nickel and one or both of carbon and silicon, for example. As the wiring 2374, a stacked-layer structure of a barrier film, an aluminum silicon (Al—Si) film, and a barrier film or a stacked-layer structure of a barrier film, an aluminum silicon (Al—Si) film, a titanium nitride film, and a barrier film may be employed, for example. Note that the barrier film corresponds to a thin film formed of titanium, titanium nitride, molybdenum, or molybdenum nitride. Since aluminum and aluminum silicon have low resistance values and are inexpensive, aluminum and aluminum silicon are suitable for a material for forming the wiring 2374. In addition, by providing the barrier films in an upper layer and a lower layer, generation of a hillock of aluminum or aluminum silicon can be prevented. Further, by forming a barrier film with titanium which is an element having a high reducing property, even when a thin natural oxide film is formed over the crystalline semiconductor films, the natural oxide film can be chemically reduced and an excellent contact with the crystalline semiconductor films can be obtained.

Note that the structure of the transistor which forms the semiconductor device of the invention is not limited to the structure which is shown. For example, a transistor with a structure such as an inversely-staggered structure or a Fin-FET structure can be used. It is preferable to use a Fin-FET structure because a short-channel effect in accordance with miniaturization of a size of the transistor can be suppressed.

Note that this embodiment mode can be freely combined with any description in the aforementioned embodiment modes. That is, by employing the invention, a semiconductor device can be provided in which a malfunction such as an incorrect operation or no response in accordance with generation of a clock signal is prevented and information stored in the memory circuit can be exactly transmitted.

Embodiment 4

In this embodiment, a method for manufacturing a wireless chip, which is different from that of the aforementioned embodiment, is described. The transistor in the invention can also be formed of a MOS transistor provided by a manufacturing method which is different from that of the MOS transistor formed over the single crystalline substrate described in the aforementioned embodiment.

In this embodiment, a p-channel TFT (also described as a Pch-TFT) and an n-channel TFT (also described as an Nch-TFT) which form an inverter or the like are typically shown as a circuit which forms the wireless chip. Hereinafter, the method for manufacturing the wireless chip is described with reference to cross-sectional views shown in FIGS. 17A to 20B.

First, an insulating film is formed over a substrate 2600. Here, single crystalline silicon having n-type conductivity is used as the substrate 2600, and an insulating film 2602 and an insulating film 2604 are formed over the substrate 2600 (see FIG. 17A). For example, silicon oxide ($SiO_x$) is formed as the insulating film 2602 by performing heat treatment on the substrate 2600 and silicon nitride ($SiN_x$) is formed over the insulating film 2602 by CVD.

In addition, any substrate can be used as the substrate 2600 as long as it is a semiconductor substrate, without particularly limiting to a certain type. For example, a single crystalline silicon substrate having n-type or p-type conductivity, a compound semiconductor substrate (e.g., a GaAs substrate, an InP substrate, a GaN substrate, a SiC substrate, a sapphire substrate, or a ZnSe substrate), an SOI (Silicon On Insulator) substrate manufactured by using a bonding method or a SIMOX (Separation by Implanted Oxygen) method, or the like can be used.

In addition, the insulating film 2604 may be provided by nitriding the insulating film 2602 by high-density plasma treatment after the insulating film 2602 is formed. Note that the insulating film provided over the substrate 2600 may be formed with a single-layer structure or a staked-layer structure having three or more layers.

Next, a pattern of a resist mask 2606 is selectively formed over the insulating film 2604 and etching is selectively performed using the resist mask 2606 as a mask, so that depressions 2608 are selectively formed in the substrate 2600 (see FIG. 17B). Etching of the substrate 2600 and the insulating films 2602 and 2604 can be performed by dry etching utilizing plasma.

Next, an insulating film 2610 is formed so as to fill the depressions 2608 formed in the substrate 2600 after the pattern of the resist mask 2606 is removed (see FIG. 17C).

The insulating film 2610 is formed using an insulating material such as silicon oxide, silicon nitride, silicon oxynitride ($SiO_xN_y$) (x>y>0), or silicon nitride oxide ($SiN_xO_y$) (x>y>0) by CVD, sputtering, or the like. Here, a silicon oxide film is formed as the insulating film 2610 by using TEOS (Tetra-Ethyl-Ortho Silicate) gas by normal-pressure CVD or low-pressure CVD.

Next, a surface of the substrate 2600 is exposed by performing grinding treatment, polishing treatment, or CMP (Chemical Mechanical Polishing) treatment. Here, by exposing the surface of the substrate 2600, each of regions 2612 and 2613 is provided between insulating films 2611 formed in the depressions 2608 of the substrate 2600. Note that the insulating films 2611 are formed by removing the insulating film 2610 formed on the surface of the substrate 2600 by grinding treatment, polishing treatment, or CMP treatment. Subsequently, an impurity element having p-type conductivity is selectively introduced, so that a p-well 2615 is formed in the regions 2613 and 2614 of the substrate 2600 (see FIG. 18A).

As the impurity element having p-type conductivity, boron (B), aluminum (Al), gallium (Ga), or the like can be used. Here, boron (B) is introduced into the regions 2613 and 2614 as the impurity element.

Note that although an impurity element is not introduced into the region 2612 because a semiconductor substrate having n-type conductivity is used as the semiconductor substrate 2600 in this embodiment, an n-well may be formed in the region 2612 by introducing an impurity element which imparts n-type conductivity. As the impurity element which imparts n-type conductivity, phosphorus (P), arsenic (As), or the like can be used.

On the other hand, in the case where a semiconductor substrate having p-type conductivity is used, an n-well may be formed in the region 2612 by introducing an impurity element which imparts n-type conductivity and no impurity element may be introduced into the regions 2613 and 2614.

Figure 18A:
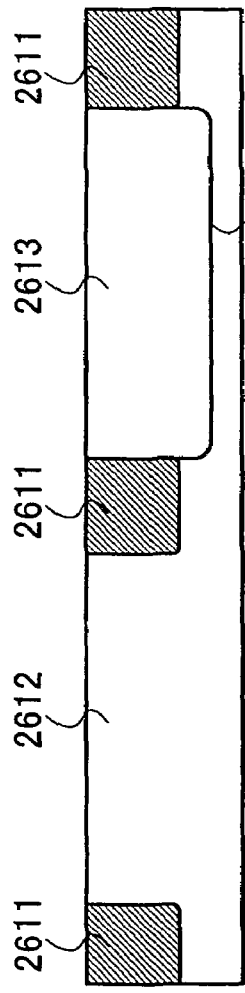
FIGS. 18A to 18C each illustrate a structure of Embodiment 4 using the invention.
Figure 18B:
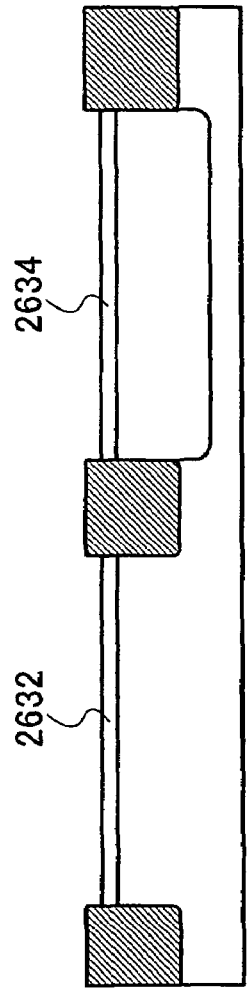

Next, insulating films 2632 and 2634 are formed on the surfaces of the regions 2612 and 2613 of the substrate 2600, respectively (see FIG. 18B).

For example, each of the insulating films 2632 and 2634 can be formed of a silicon oxide film by oxidizing each surface of the regions 2612 and 2613 provided in the semiconductor substrate 2600 by performing heat treatment. Alternatively, each of the insulating films 2632 and 2634 may be formed of a stacked structure of a silicon oxide film and a film including oxygen and nitrogen (a silicon oxynitride film) by forming the silicon oxide film using a thermal oxidation method and then nitriding the surface of the silicon oxide film by nitriding treatment.

Alternatively, the insulating films 2632 and 2634 may be formed using plasma treatment as described above. For example, by performing oxidizing treatment or nitriding treatment with high-density plasma treatment on the surfaces of the regions 2612 and 2613 provided in the semiconductor substrate 2600, silicon oxide ($SiO_x$) films or silicon nitride ($SiN_x$) films can be formed as the insulating films 2632 and 2634. In addition, after oxidizing treatment is performed on the surfaces of the regions 2612 and 2613 by high-density plasma treatment, nitriding treatment may be performed by performing high-density plasma treatment again. In this case, silicon oxide films are formed on the surfaces of the regions 2612 and 2613 and silicon oxynitride films are formed over the silicon oxide films, so that each of the insulating films 2632 and 2634 is formed to have a stacked-layer structure of the silicon oxide film and the silicon oxynitride film. Alternatively, after silicon oxide films are formed on the surfaces of the regions 2612 and 2613 by a thermal oxidation method, oxidizing treatment or nitriding treatment may be performed by high-density plasma treatment.

Figure 18C:
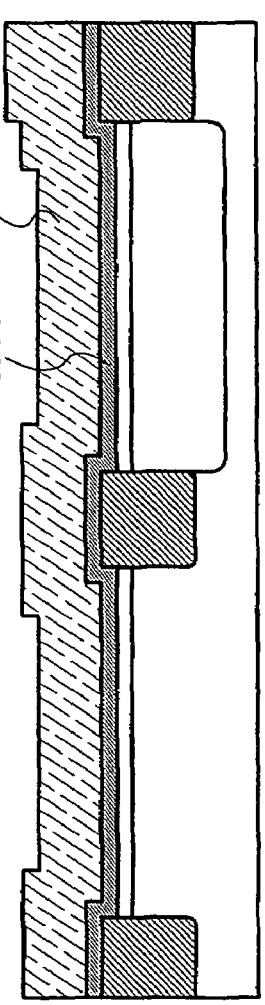

In addition, each of the insulating films 2632 and 2634 formed in the regions 2612 and 2613 of the semiconductor substrate 2600 functions as a gate insulating film in a transistor which is completed latel Next, a conductive film is formed so as to cover the insulating films 2632 and 2634 formed over the regions 2612 and 2613 provided in the substrate 2600 (see FIG. 18C). Here, an example is shown in which a conductive film 2636 and a conductive film 2638 are sequentially stacked as the conductive film. Needless to say, the conductive film may be formed with a single-layer structure or a staked-layer structure having three or more layers.

Each of the conductive films 2636 and 2638 can be formed of an element selected from tantalum (Ta), tungsten (W), titanium (Ti), molybdenum (Mo), aluminum (Al), copper (Cu), chromium (Cr), niobium (Nb), and the like, or an alloy material or a compound material which includes any of these elements as a main component. Alternatively, each of the conductive films 2636 and 2638 can be formed of a metal nitride film obtained by nitriding any of these elements. Further alternatively, each of the conductive films 2636 and 2638 can be formed of a semiconductor material typified by polycrystalline silicon doped with an impurity element such as phosphorus.

Here, a stacked-layer structure is employed in which the conductive film 2636 is formed using tantalum nitride and the conductive film 2638 is formed using tungsten thereover. Alternatively, a single-layer or stacked-layer film of tungsten nitride, molybdenum nitride, or titanium nitride can be used as the conductive film 2636, and a single-layer or stacked-layer film of tantalum, molybdenum, or titanium can be used as the conductive film 2638.

Figure 19A:
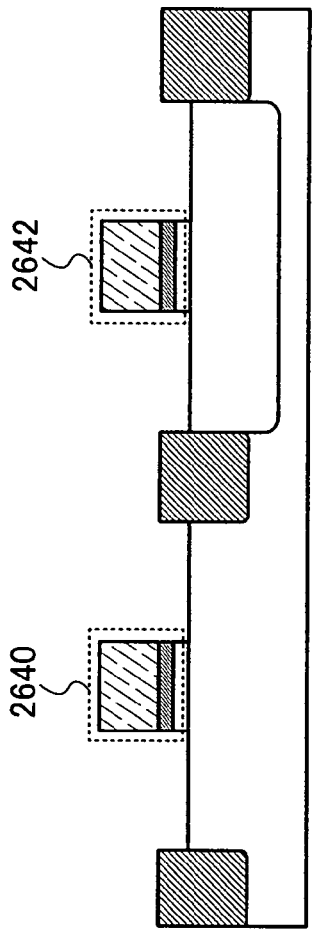
FIGS. 19A to 19C each illustrate a structure of Embodiment 4 using the invention.

Next, by selectively etching to remove the conductive films 2636 and 2638 which are stacked, the conductive films 2636 and 2638 are partially left over the regions 2612 and 2613 to form conductive films 2640 and 2642 functioning as gate electrodes (see FIG. 19A). In addition, here, parts of the surfaces of the regions 2612 and 2613, which do not overlap with the conductive films 2640 and 2642, are exposed in the substrate 2600.

Specifically, in the region 2612 of the substrate 2600, a part of the insulating film 2632 formed below the conductive film 2640, which does not overlap with the conductive film 2640, is selectively removed, so that ends of the conductive film 2640 and the insulating film 2632 almost correspond to each other. In the region 2614 of the substrate 2600, a part of the insulating film 2634 formed below the conductive film 2642, which does not overlap with the conductive film 2642 is selectively removed, so that ends of the conductive film 2642 and the insulating film 2634 almost correspond to each other.

In this case, parts of the insulating films and the like which do not overlap with the conductive films 2640 and 2642 may be removed at the same time as formation of the conductive films 2640 and 2642. Alternatively, the parts of the insulating films and the like which do not overlap with the conductive films 2640 and 2642 may be removed after formation of the conductive films 2640 and 2642 by using the left resist mask or the conductive films 2640 and 2462 as masks.

Figure 19B:
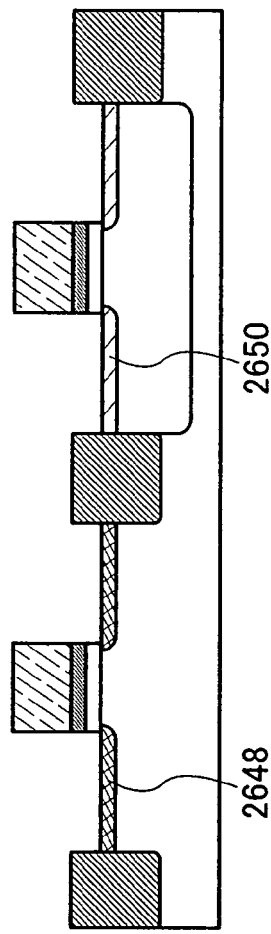

Next, an impurity element is selectively introduced into the regions 2612 and 2613 of the substrate 2600 (see FIG. 19B). Here, an impurity element which imparts n-type conductivity is selectively introduced into the region 2613 at low concentration by using the conductive film 2642 as a mask, and an impurity element which imparts p-type conductivity is selectively introduced into the region 2612 at low concentration by using the conductive film 2640 as a mask. As the impurity element which imparts n-type conductivity, phosphorus (P), arsenic (As), or the like can be used. As the impurity element which imparts p-type conductivity, boron (B), aluminum (Al), gallium (Ga), or the like can be used.

Next, sidewalls 2654 which are in contact with sides of the conductive films 2640 and 2642 are formed. Specifically, each of the sidewalls 2654 is formed with a single-layer structure or a stacked-layer structure of a film including an inorganic material such as silicon, silicon oxide, or silicon nitride, or a film including an organic material such as an organic resin by plasma CVD, sputtering, or the like. Next, the insulating film is selectively etched by anisotropic etching which is based on a perpendicular direction to form the sidewalls 2654 so as to be in contact with the sides of the conductive films 2640 and 2642. Note that the sidewalls 2654 are used as masks for doping when LDD (Lightly Doped Drain) regions are formed. Further, here, the sidewalls 2654 are formed so as to be also in contact with sides of the insulating films and the gate electrodes formed below the conductive films 2640 and 2642.

Figure 19C:
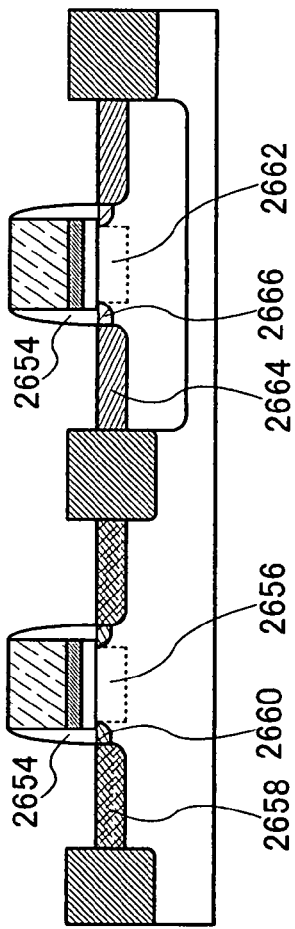

Subsequently, an impurity element is introduced into the regions 2612 and 2613 of the substrate 2600 by using the sidewalls 2654, and the conductive films 2640 and 2642 as masks, so that an impurity region functioning as a source region or a drain region is formed (see FIG. 19C). Here, an impurity element which imparts n-type conductivity is introduced into the region 2613 of the substrate 2600 at high concentration by using the sidewalls 2654 and the conductive film 2642 as masks, and an impurity element which imparts p-type conductivity is introduced into the region 2612 at high concentration by using the sidewalls 2654 and the conductive film 2640 as masks.

Accordingly, in the region 2612 of the substrate 2600, an impurity region 2658 which forms a source region or a drain region, a low-concentration impurity region 2660 which forms an LDD region, and a channel formation region 2656 are formed. In the region 2613 of the substrate 2600, an impurity region 2664 which forms a source region or a drain region, a low-concentration impurity region 2666 which forms an LDD region, and a channel formation region 2662 are formed.

Note that in this embodiment, addition of the impurity element is performed in a condition in which parts of the regions 2612 and 2613 of the substrate 2600, which do not overlap with the conductive films 2640 and 2642, are exposed. Therefore, the channel formation regions 2656 and 2662 formed in the regions 2612 and 2613 of the substrate 2600 respectively can be formed in a self-aligned manner with the conductive films 2640 and 2642.

Figure 20A:
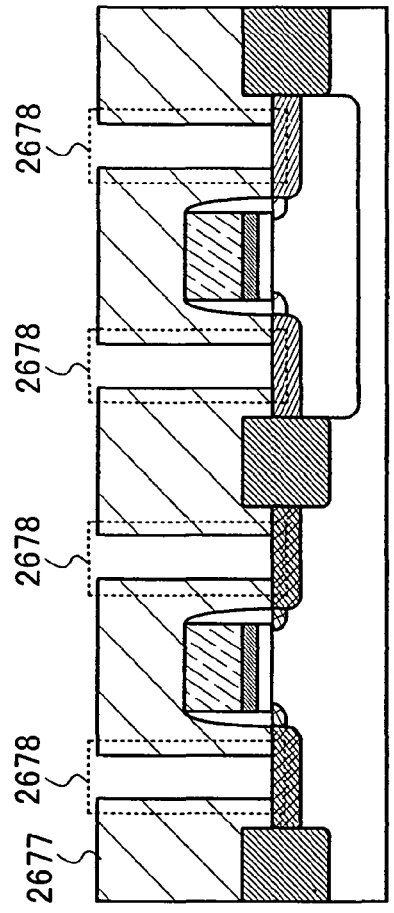
FIGS. 20A and 20B each illustrate a structure of Embodiment 4 using the invention.

Next, a second insulating films 2677 is formed so as to cover the insulating films, the conductive films, and the like provided over the regions 2612 and 2613 of the substrate 2600, and openings 2678 are formed in the insulating films 2677 (see FIG. 20A).

The second insulating film 2677 can be provided to have a single-layer structure or a stacked-layer structure formed of an insulating film including oxygen or nitrogen such as silicon oxide ($SiO_x$), silicon nitride ($SiN_x$), silicon oxynitride ($SiO_xN_y$) (x>y), or silicon nitride oxide ($SiN_yO_x$) (x>y), a film including carbon such as DLC (diamond like carbon), an organic material such as epoxy, polyimide, polyamide, polyvinyl phenol, benzocyclobutene, or acryl, or a siloxane material such as a siloxane resin. Note that the siloxane material corresponds to a material including a Si—O—Si bond. Siloxane has a skeletal structure with the bond of silicon (Si) and oxygen (O). As a substituent, an organic group including at least hydrogen (e.g., an alkyl group or aromatic hydrocarbon) is used. As the substituent, a fluoro group can also be used. Alternatively, as the substituent, the organic group including at least hydrogen and the fluoro group may be used.

Figure 20B:
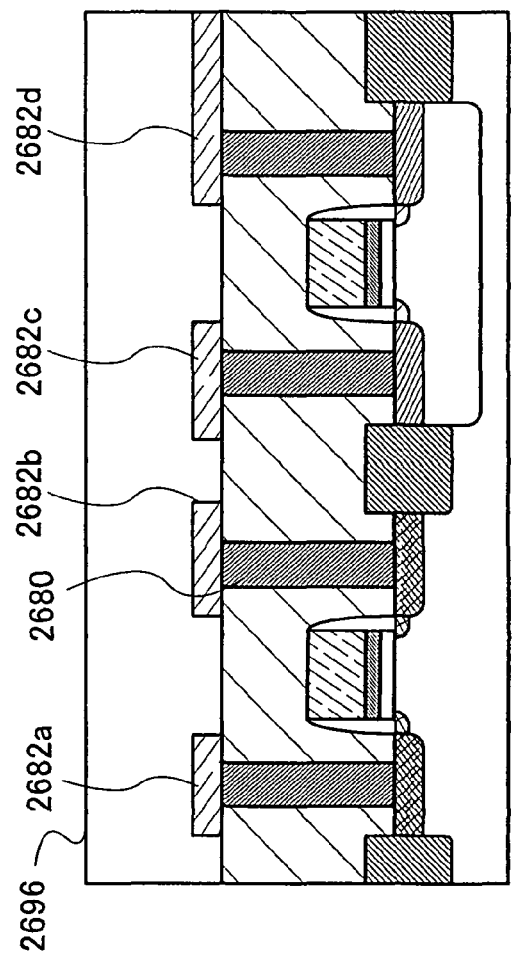

Next, conductive films 2680 are formed in the openings 2678 by using CVD, and conductive films 2682a to 2682d are selectively formed over the insulating film 2677 so as to be electrically connected to the conductive films 2680 (see FIG. 20B).

Each of the conductive films 2680 and 2682a to 2682d is formed of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material which includes any of these elements as a main component, and has a single-layer structure or a stacked-layer structure. An alloy material which includes aluminum as a main component corresponds to a material which includes aluminum as a main component and includes nickel, or an alloy material which includes aluminum as a main component and includes nickel and one or both of carbon and silicon, for example. As the conductive film 1313, a stacked-layer structure of a barrier film, an aluminum silicon (Al—Si) film, and a barrier film or a stacked-layer structure of a barrier film, an aluminum silicon (Al—Si) film, a titanium nitride film, and a barrier film may be employed, for example. Note that the barrier film corresponds to a thin film formed of titanium, titanium nitride, molybdenum, or molybdenum nitride. Since aluminum and aluminum silicon have low resistance values and are inexpensive, aluminum and aluminum silicon are suitable for a material for forming the conductive film 1313. In addition, by providing the barrier films in an upper layer and a lower layer, generation of a hillock of aluminum or aluminum silicon can be prevented. Further, by forming a barrier film with titanium which is an element having a high reducing property, even when a thin natural oxide film is formed over the crystalline semiconductor films, the natural oxide film can be chemically reduced and an excellent contact with the crystalline semiconductor films can be obtained. Here, the conductive film 2680 can be formed by selectively growing tungsten (W) by CVD.

By the above-described steps, a semiconductor device which includes a p-channel transistor formed in the region 2612 of the substrate 2600 and an n-channel transistor formed in the region 2613 of the substrate 2600 can be obtained.

Note that the structure of the transistor which forms the semiconductor device of the invention is not limited to the structure which is shown. For example, a transistor with a structure such as an inversely-staggered structure or a Fin-FET structure can be used. It is preferable to use a Fin-FET structure because a short-channel effect in accordance with miniaturization of a size of the transistor can be suppressed.

Note that this embodiment mode can be freely combined with any description in the aforementioned embodiment modes. Note that this embodiment mode can be freely combined with any description in the aforementioned embodiment modes by employing the invention, a semiconductor device can be provided in which a malfunction such as an incorrect operation or no response in accordance with generation of a clock signal is prevented and information stored in the memory circuit can be exactly transmitted.

Embodiment 5

Figure 21A:
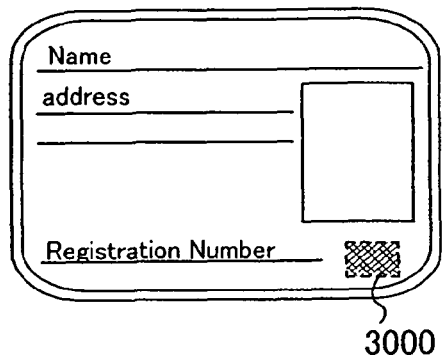
FIGS. 21A to 21F each illustrate a structure of Embodiment 5 using the invention.
Figure 21B:
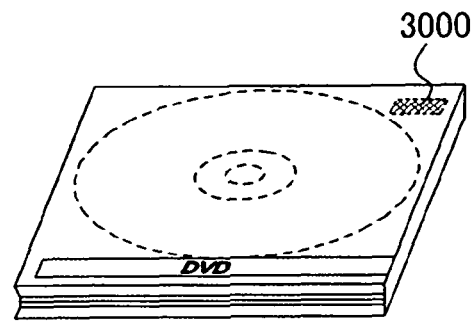
Figure 21C:
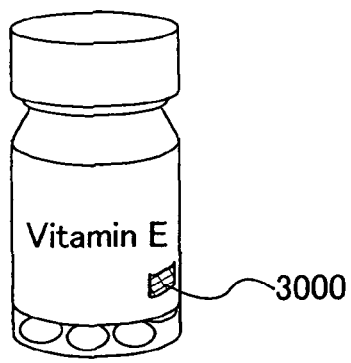
Figure 21D:
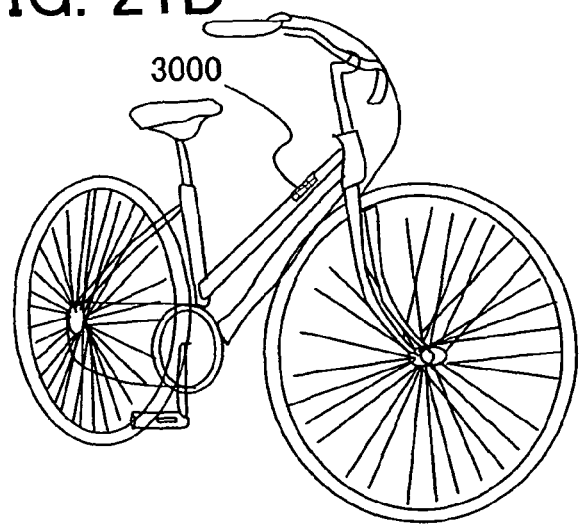
Figure 21E:
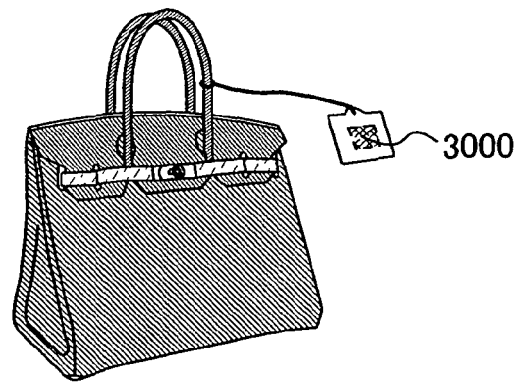
Figure 21F:
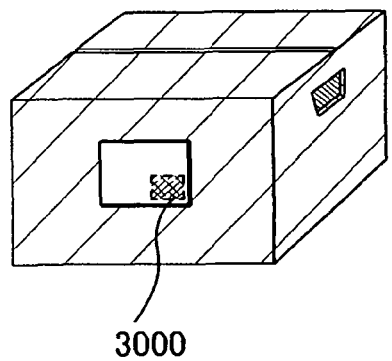

A method for using a semiconductor device 3000 functioning as the wireless chip which is described in the aforementioned embodiments is described with reference to FIGS. 21A to 21E The wireless chip can be used widely and can be used by being provided in products such as bills, coins, securities, bearer bonds, certificates (e.g., driver's licenses or resident cards, see FIG. 21A), containers for wrapping (e.g., wrapping paper or bottles, see FIG. 21C), recording media (e.g., DVDs or video tapes, see FIG. 21B), vehicles (e.g., bicycles, see FIG. 21D), products such as personal belongings (e.g., bags or glasses), foods, plants, animals, clothes, livingwares, or electronic devices, or objects such as shipping tags of baggage (see FIGS. 21E and 21F). The electronic devices correspond to a liquid crystal display device, an EL display device, a television device (also referred to as a TV simply, a TV receiver, or a television receiver), a mobile phone, and the like.

The semiconductor device 3000 of the invention includes a memory element of the invention and is fixed to an object by being mounted on a printed board, attached to a surface, or embedded therein. For example, the semiconductor device is fixed to an object by being embedded in a paper of a book or an organic resin of a package. As for the semiconductor device 3000 of the invention, reduction in size, thickness, and weight is achieved so that an attractive design of the object itself is not spoiled even after being fixed in the object. In addition, by providing the semiconductor device 3000 of the invention in bills, coins, securities, bearer bonds, certificates, or the like, a certification function can be provided so that forgery thereof can be prevented by utilizing the certification function. Further, by attaching the semiconductor device 3000 of the invention to containers for wrapping, recording media, personal belongings, foods, clothes, livingwares, electronic devices, or the like, a system such as an inspection system can be efficiently performed.

Note that this embodiment can be freely combined with any description in the aforementioned embodiment modes. That is, selective precharge of each bit line can be performed in the memory mounted on the semiconductor device. That is, a semiconductor device on which a low-power consumption memory is mounted can be provided by not precharging a bit line which does not relate to reading of data from the memory.

This application is based on Japanese Patent Application serial No. 2006-181885 filed in Japan Patent Office on Jun. 30, 2006, the entire contents of which are hereby incorporated by reference.

What is claimed is:

1. A semiconductor device comprising:
an antenna circuit for receiving a wireless signal;
a power supply circuit generating a power by the wireless signal received by the antenna circuit; and
a clock generation circuit to which the power is supplied,
wherein the clock generation circuit includes a ring oscillator for generating a self-oscillating signal of a constant period, and a frequency divider for frequency-dividing the self-oscillating signal,
wherein the ring oscillator generates the self-oscillating signal by the power supplied from the power supply circuit,
wherein the ring oscillator comprises at least a first stage and a second stage,
wherein each of the first stage and the second stage comprises an input terminal, an output terminal, a first transistor, a second transistor, a third transistor and a fourth transistor,
wherein a gate of the first transistor and a gate of the second transistor are electrically connected to the input terminal,
wherein a first terminal of the first transistor, a first terminal of the second transistor, a gate of the third transistor, and a gate of the fourth transistor are electrically connected to the output terminal,
wherein a source or drain terminal of the third transistor and a source or drain terminal of the fourth transistor are configured to be applied a controlled voltage,
wherein the output terminal of the first stage is electrically connected to the input terminal of the second stage,
wherein the frequency divider is connected to the ring oscillator in series, and
wherein a clock signal is output from an output terminal of the frequency divider.

2. A semiconductor device comprising:
an antenna circuit for receiving a wireless signal;
a power supply circuit generating a power by the wireless signal received by the antenna circuit; and
a clock generation circuit to which the power is supplied,
wherein the clock generation circuit includes a ring oscillator for generating a self-oscillating signal of a constant period, and a frequency divider for frequency-dividing the self-oscillating signal,
wherein the ring oscillator generates the self-oscillating signal by the power supplied from the power supply circuit,
wherein the ring oscillator comprises at least a first stage and a second stage,
wherein each of the first stage and the second stage comprises an input terminal, an output terminal, a first transistor, a second transistor and a capacitor,
wherein a gate of the first transistor and a gate of the second transistor are electrically connected to the input terminal,
wherein a first terminal of the first transistor, a first terminal of the second transistor and one terminal of the capacitor are electrically connected to the output terminal,
wherein the other terminal of the capacitor is configured to be applied a controlled voltage,
wherein the output terminal of the first stage is electrically connected to the input terminal of the second stage,
wherein the frequency divider is connected to the ring oscillator in series, and
wherein a clock signal is output from an output terminal of the frequency divider.

3. A semiconductor device comprising:
an antenna circuit for receiving a wireless signal;
a power supply circuit generating a power by the wireless signal received by the antenna circuit;
a data modulation circuit for modulating the wireless signal;
a data demodulation circuit for demodulating a signal modulated by the data modulation circuit;
a control circuit operationally connected to the data modulation circuit and the data demodulation circuit; and
a clock generation circuit for supplying a clock signal to the control circuit, including a ring oscillator and a frequency divider,
wherein the ring oscillator generates a self-oscillating signal by the power supplied from the power supply circuit,
wherein the ring oscillator comprises at least a first stage and a second stage,
wherein each of the first stage and the second stage comprises an input terminal, an output terminal, a first transistor, a second transistor, a third transistor and a fourth transistor,
wherein a gate of the first transistor and a gate of the second transistor are electrically connected to the input terminal,
wherein a first terminal of the first transistor, a first terminal of the second transistor, a gate of the third transistor, and a gate of the fourth transistor are electrically connected to the output terminal,
wherein a source or drain terminal of the third transistor and a source or drain terminal of the fourth transistor are configured to be applied a controlled voltage,
wherein the output terminal of the first stage is electrically connected to the input terminal of the second stage,
wherein the frequency divider is connected to the ring oscillator in series, wherein the clock signal is output from an output terminal of the frequency divider, and wherein the clock signal is supplied to the control circuit.

4. The semiconductor device according to claim 2, wherein the capacitor is an element using a gate capacitance of a MOS transistor.

5. The semiconductor device according to claim 2, wherein the capacitor is a variable capacitor.

6. The semiconductor device according to claim 1, wherein a transistor used for the ring oscillator and the frequency divider is a thin film transistor.

7. The semiconductor device according to claim 2, wherein a transistor used for the ring oscillator and the frequency divider is a thin film transistor.

8. The semiconductor device according to claim 3, wherein a transistor used for the ring oscillator and the frequency divider is a thin film transistor.

9. The semiconductor device according to claim 1, wherein a transistor used for the ring oscillator and the frequency divider is formed on a single crystalline substrate.

10. The semiconductor device according to claim 2, wherein a transistor used for the ring oscillator and the frequency divider is formed on a single crystalline substrate.

11. The semiconductor device according to claim 3, wherein a transistor used for the ring oscillator and the frequency divider is formed on a single crystalline substrate.

12. An electronic device comprising a wireless chip of the semiconductor device according to claim 1.

13. An electronic device comprising a wireless chip of the semiconductor device according to claim 2.

14. An electronic device comprising a wireless chip of the semiconductor device according to claim 3.

* * * * *